(12) United States Patent
Eichler et al.

(10) Patent No.: US 9,048,631 B2
(45) Date of Patent: Jun. 2, 2015

(54) LASER LIGHT SOURCE

(75) Inventors: Christoph Eichler, Tegernheim (DE); Dimitri Dini, Munich (DE); Alfred Lell, Maxhütte-Haidhof (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/006,472

(22) PCT Filed: Apr. 18, 2012

(86) PCT No.: PCT/EP2012/057073
§ 371 (c)(1),
(2), (4) Date: Nov. 18, 2013

(87) PCT Pub. No.: WO2012/150132
PCT Pub. Date: Nov. 8, 2012

(65) Prior Publication Data
US 2014/0064311 A1    Mar. 6, 2014

(30) Foreign Application Priority Data
May 2, 2011    (DE) .......................... 10 2011 100 175

(51) Int. Cl.
*H01S 5/22*    (2006.01)
*H01S 5/065*    (2006.01)
(Continued)

(52) U.S. Cl.
CPC ................ *H01S 5/22* (2013.01); *H01S 5/2218* (2013.01); *H01S 5/2219* (2013.01); *H01S 5/2222* (2013.01); *H01S 5/065* (2013.01); *B82Y 20/00* (2013.01); *H01S 5/0217* (2013.01);
(Continued)

(58) Field of Classification Search
CPC ....... H01S 5/22; H01S 5/2218; H01S 5/2219; H01S 5/222; H01S 5/065
USPC .......................................................... 372/45.01
See application file for complete search history.

(56) References Cited

U.S. PATENT DOCUMENTS 6,445,723 B1 *    9/2002    Ziari et al. ................. 372/46.01
2003/0219053 A1 *    11/2003    Swint et al. ..................... 372/46
(Continued)

FOREIGN PATENT DOCUMENTS

CN    101710670 A    5/2010
DE    102006046297 A1    4/2008
(Continued)

OTHER PUBLICATIONS

De Mesel, K., et al., "First demonstration of 980 nm oxide confined laser with integrated spot size converter," Electronics Letters, vol. 36, No. 12, Jun. 8, 2000, pp. 1028-1029.
(Continued)

*Primary Examiner* — Armando Rodriguez
(74) *Attorney, Agent, or Firm* — Slater & Matsil, L.L.P.

(57) ABSTRACT

A laser light source having a ridge waveguide structure includes a semi-conductor layer sequence having a number of functional layers and an active region that is suitable for generating laser light during operation. At least one of the functional layers is designed as a ridge of the ridge waveguide structure. The semiconductor layer sequence has a mode filter structure that is formed as part of the ridge and/or along a main extension plane of the functional layers next to the ridge and/or perpendicular to the main extension plane of the functional layers below the ridge.

20 Claims, 19 Drawing Sheets

(51) Int. Cl.
    *B82Y 20/00* (2011.01)
    *H01S 5/10* (2006.01)
    *H01S 5/223* (2006.01)
    *H01S 5/227* (2006.01)
    *H01S 5/02* (2006.01)
    *H01S 5/028* (2006.01)
    *H01S 5/20* (2006.01)
    *H01S 5/343* (2006.01)

(52) U.S. Cl.
    CPC ............ *H01S 5/0287* (2013.01); *H01S 5/1064*
    (2013.01); *H01S 5/2022* (2013.01); *H01S*
    *5/2031* (2013.01); *H01S 5/2059* (2013.01);
    *H01S 5/2215* (2013.01); *H01S 5/2231*
    (2013.01); *H01S 5/2275* (2013.01); *H01S*
    *5/34326* (2013.01); *H01S 5/34333* (2013.01);
    *H01S 2301/166* (2013.01); *H01S 2301/176*
    (2013.01); *H01S 2301/185* (2013.01); *H01S*
    *5/101* (2013.01); *H01S 5/1014* (2013.01); *H01S*
    *5/1017* (2013.01)

(56) References Cited

U.S. PATENT DOCUMENTS

| | | |
|---|---|---|
| 2004/0004217 A1 | 1/2004 | Jayaraman |
| 2004/0025846 A1 | 2/2004 | Draper et al. |
| 2004/0125846 A1 | 7/2004 | Zediker et al. |
| 2005/0139856 A1 | 6/2005 | Hino et al. |
| 2006/0011946 A1 | 1/2006 | Toda et al. |
| 2006/0193353 A1* | 8/2006 | Kim et al. ............... 372/19 |
| 2007/0258495 A1 | 11/2007 | Hamamoto et al. |
| 2008/0089374 A1* | 4/2008 | Eichler et al. ............ 372/45.01 |
| 2008/0273564 A1 | 11/2008 | Wang et al. |
| 2009/0129418 A1 | 5/2009 | Matsumura |
| 2011/0051766 A1 | 3/2011 | Reill et al. |

FOREIGN PATENT DOCUMENTS

| | | |
|---|---|---|
| DE | 102008013896 | * 6/2009 |
| DE | 102008013896 A1 | 6/2009 |
| JP | 2003-163415 A | 6/2003 |
| JP | 2005-183821 A | 7/2005 |
| WO | 0178206 A1 | 10/2001 |
| WO | 2009039811 A2 | 4/2009 |

OTHER PUBLICATIONS

Casey, H.C., et al., "Heterostructure Lasers; Part A; Fundamental Principles," Section 2.5, Solution of the eigenvalue equation for the symmetric three-layer slab waveguide, pp. 43-57.

Ikeda, M., et al., "High-power GaN-based semiconductor lasers," Physica Status Solidi (c), vol. 1, No. 6, 2004, pp. 1461-1467.

* cited by examiner

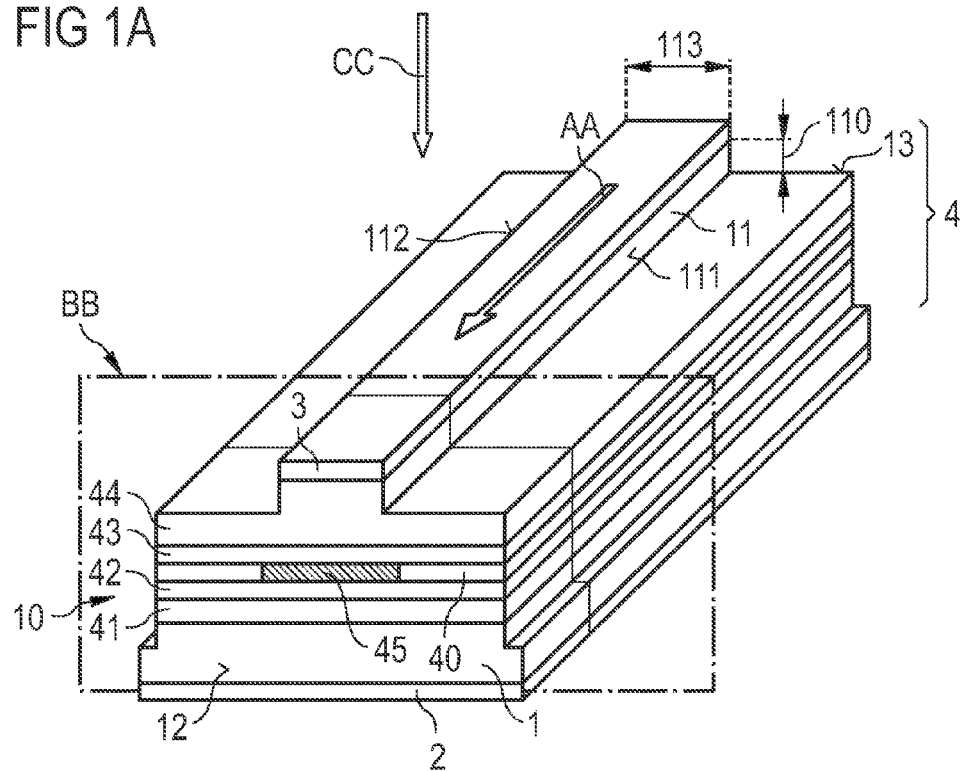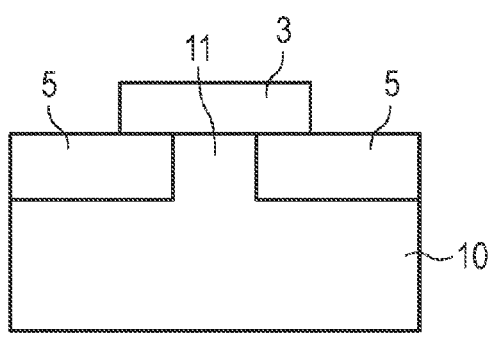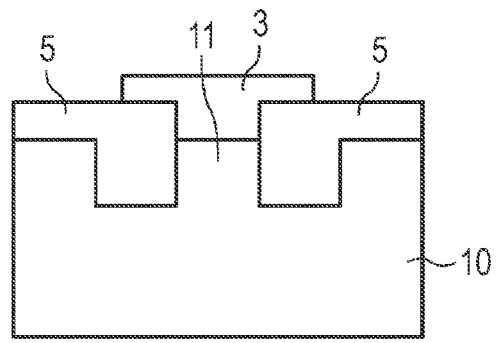

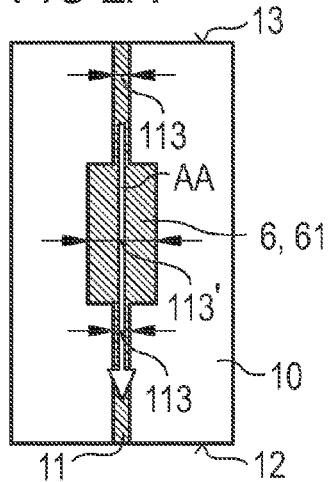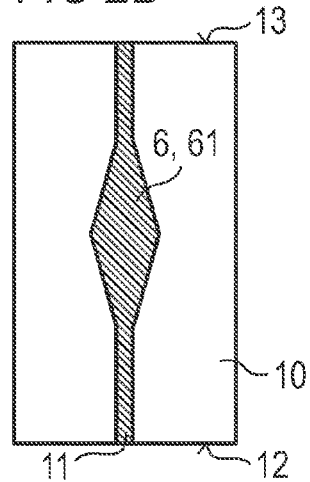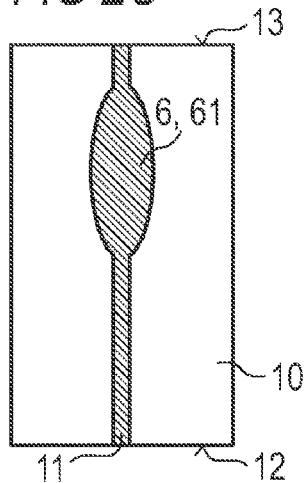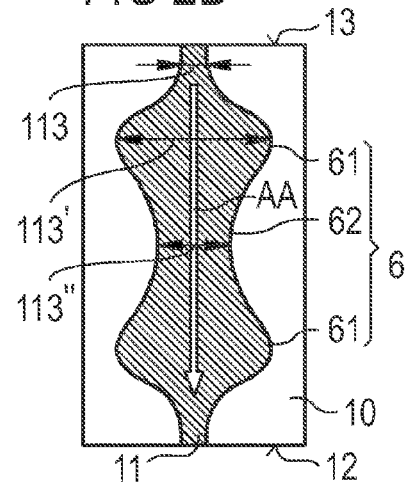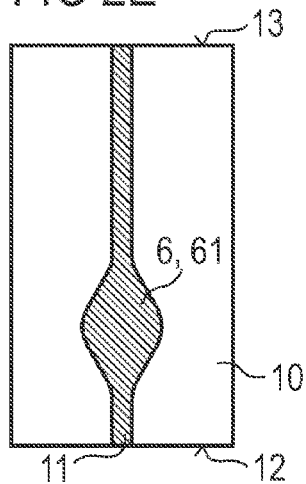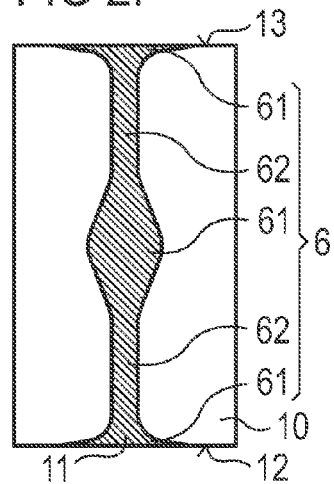

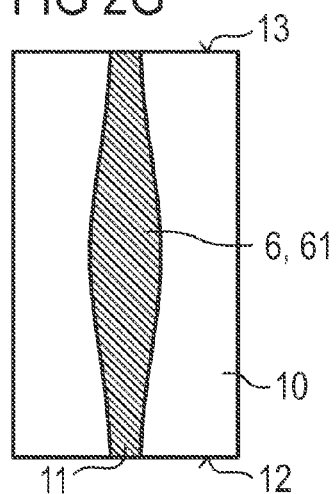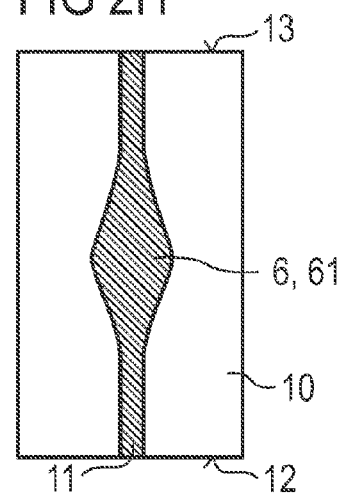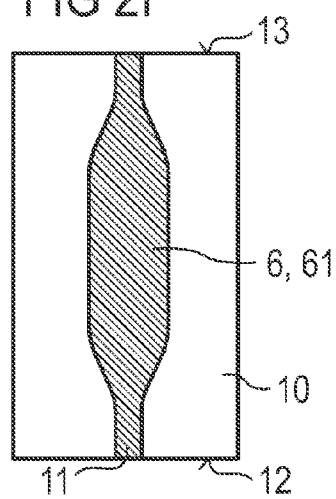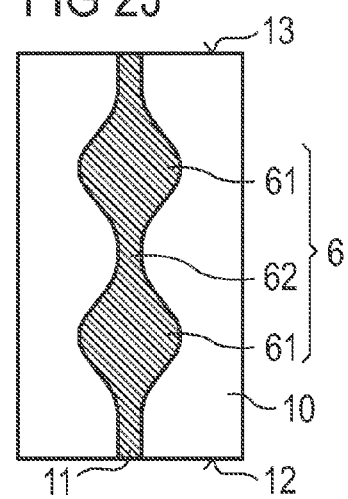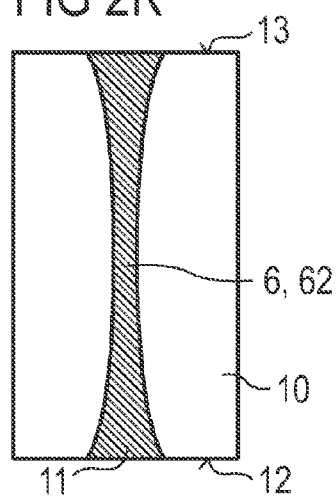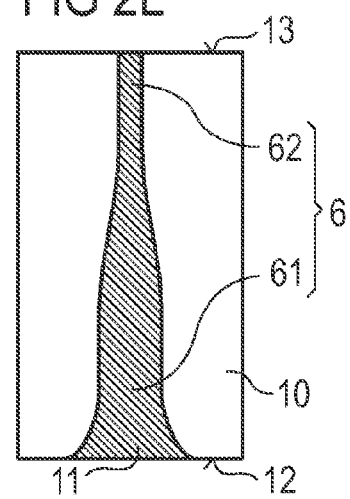

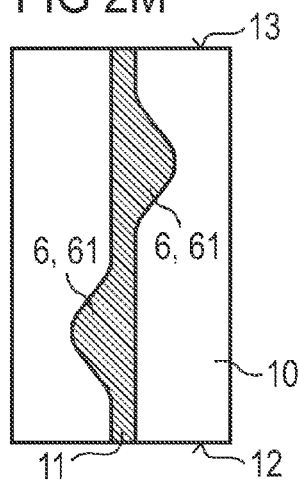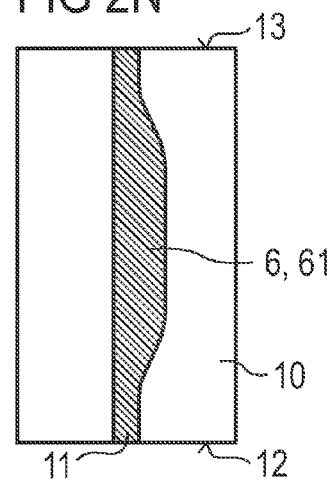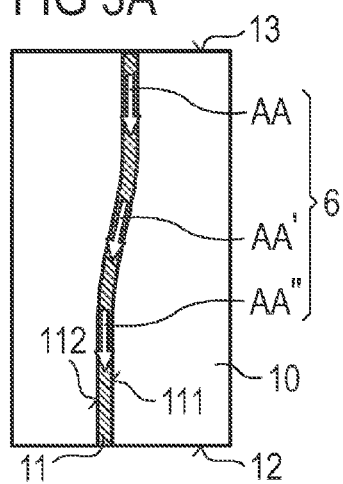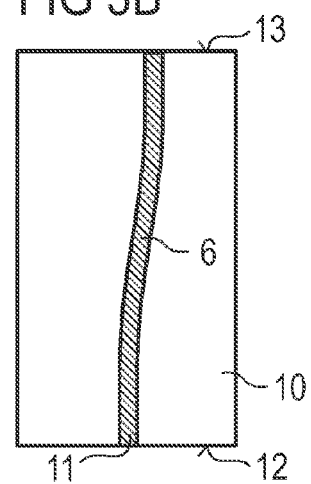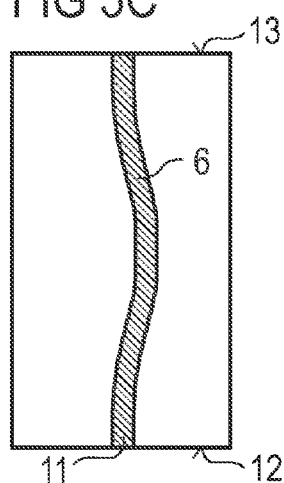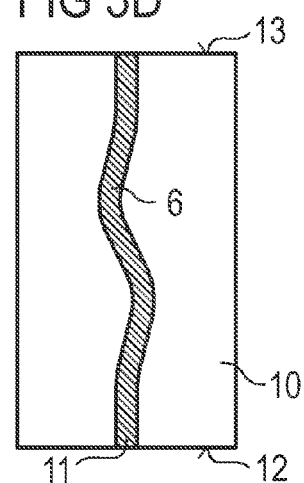

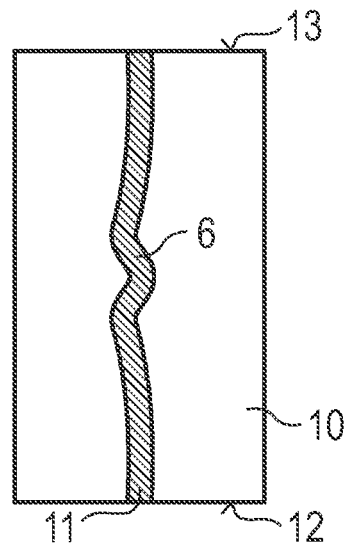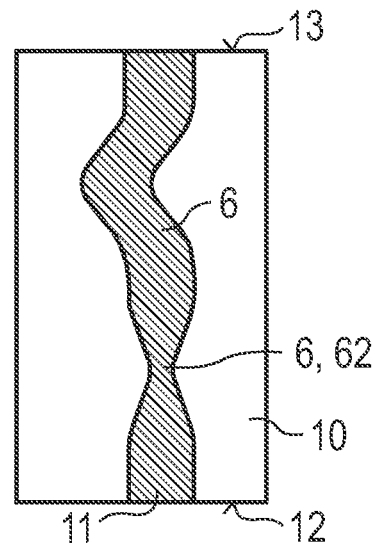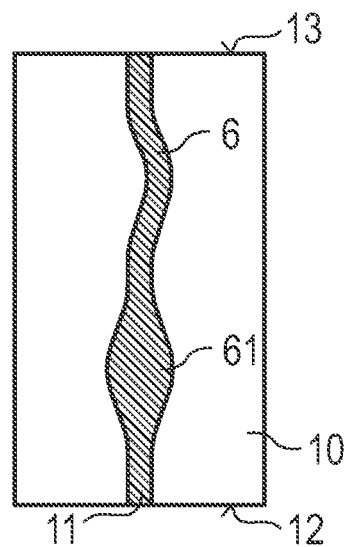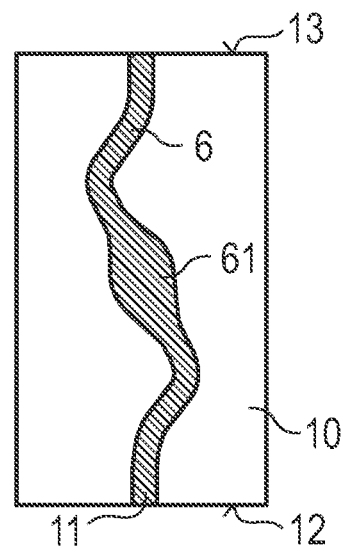

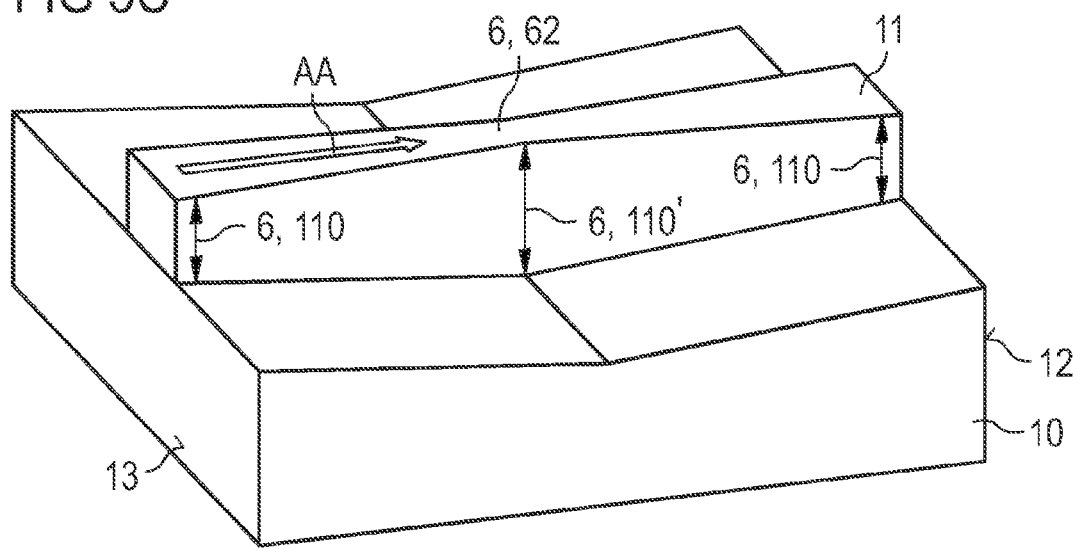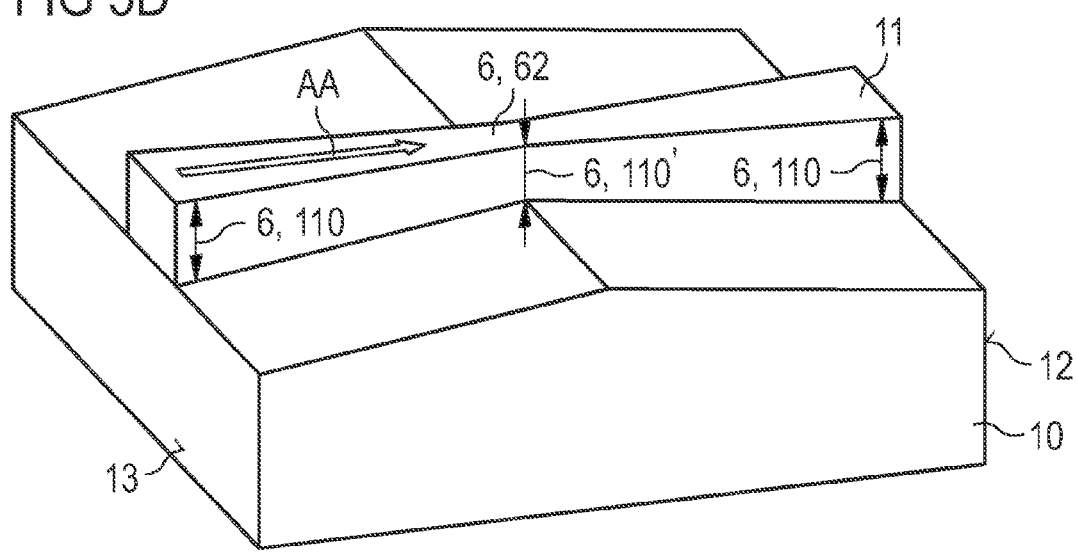

LASER LIGHT SOURCE

This patent application is a national phase filing under section 371 of PCT/EP2012/057073, filed Apr. 18, 2012, which claims the priority of German patent application 10 2011 100 175.5, filed May 2, 2011, each of which is incorporated herein by reference in its entirety.

TECHNICAL FIELD

The present invention relates to a laser light source.

BACKGROUND

For projection applications, laser sources in fundamental mode operation or monomode operation with ever higher powers are required in order, with increasing image diagonals of the projection area, to obtain sufficient brightnesses and nevertheless to achieve a very high efficiency. Moreover, in many cases a low aspect ratio of the laser beam is desirable in order to be able to simplify complex and lossy lens systems.

In typical index-guided laser structures such as, for instance, laser diodes having ridge waveguide structures, a monomode nature is achieved by the laser ridge having an extremely small width. However, this constitutes a significant disadvantage in the high technological requirements, since conventional exposure and etching technologies are encountering their limits. A further major disadvantage of such narrow ridge widths consists in the increased operating voltages necessary for operating such laser diodes.

A further possibility for improving the monomode nature of a laser diode having a ridge waveguide structure consists in a small ridge height. The resultant weak optical guidance has the effect that only the fundamental mode can establish oscillations. However, this simultaneously leads to increased threshold currents, since a weak wave guidance or a small height of the ridge is generally associated with current spreading.

It is furthermore known to apply absorber layers to a thin passivation layer alongside the laser ridge. However, since very thin passivation layers are required for this configuration, electrical problems can occur, for instance with regard to the breakdown strength or with regard to leakage currents. Furthermore, it is disadvantageous in this case that generally it is not possible to prevent the fundamental mode from also being damped by the absorber, which means losses in the laser parameters, in particular a reduced efficiency.

SUMMARY OF THE INVENTION

At least one embodiment specifies a laser light source having a semiconductor layer sequence.

In accordance with at least one embodiment, a laser light source comprises a semiconductor layer sequence having a plurality of functional layers. In particular, the semiconductor layer sequence has an active layer having an active region, which can generate laser light during the operation of the laser light source. The functional layers each have a main extension plane that is perpendicular to the arrangement direction of the functional layers arranged one above another.

In accordance with a further embodiment, the laser light source is embodied as an edge emitting laser diode. For this purpose, the semiconductor layer sequence has a side face which is at least inclined relative to the main extension plane of the functional layers and is, for example, perpendicular or substantially perpendicular thereto and which is embodied as a radiation coupling-out area, such that the laser light can be emitted via the radiation coupling-out area during operation. Preferably, the semiconductor layer sequence can have a first and a second waveguide layer, between which the active region is arranged. In particular, the semiconductor layer sequence can have an optical resonator for the laser light. Said optical resonator can comprise in particular a first at least partly reflective layer, for example, a mirror layer, on the radiation coupling-out area and/or a second at least partly reflective layer, for example, a mirror layer, on a side face of the semiconductor layer sequence situated opposite the radiation coupling-out area, between which the active region is arranged.

The semiconductor layer sequence can be embodied as an epitaxial layer sequence or as a radiation-emitting semiconductor chip having an epitaxial layer sequence, that is to say as an epitaxially grown semiconductor layer sequence. In this case, the semiconductor layer sequence can be embodied, for example, on the basis of InGaAlN. InGaAlN-based semiconductor chips and semiconductor layer sequences include, in particular, those in which the epitaxially produced semiconductor layer sequence generally has a layer sequence, composed of different individual layers, which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$.

Semiconductor layer sequences having at least one active layer based on InGaAlN can, for example, preferably emit electromagnetic radiation in an ultraviolet to green wavelength range.

Alternatively or additionally, the semiconductor layer sequence or the semiconductor chip can also be based on InGaAlP, that is to say that the semiconductor layer sequence can have different individual layers, of which at least one individual layer comprises a material from the III-V compound semiconductor material system $In_xAl_yGa_{1-x-y}P$ where $0 \leq x \leq 1$, $0 \leq y \leq 1$ and $x+y \leq 1$.

Semiconductor layer sequences or semiconductor chips having at least one active layer based on InGaAlP can, for example, preferably emit electromagnetic radiation having one or more spectral components in a green to red wavelength range.

Alternatively or additionally, the semiconductor layer sequence or the semiconductor chip can also comprise other III-V compound semiconductor material systems, for example, an AlGaAs-based material, or II-VI compound semiconductor material systems. In particular, an active layer comprising an AlGaAs-based material can be suitable for emitting electromagnetic radiation having one or more spectral components in a red to infrared wavelength range.

The semiconductor layer sequence can furthermore have a substrate on which the abovementioned III-V or II-VI compound semiconductor material systems are deposited. The functional layers can be grown on the substrate, which is then embodied as a growth substrate. As an alternative thereto, the functional layers can be transferred to the substrate after growth, said substrate then being embodied as a carrier substrate. The substrate can comprise a semiconductor material, for example, a compound semiconductor material system mentioned above. In particular, the substrate can comprise GaP, GaN, SiC, Si, Ge and/or sapphire or be composed of such a material.

The semiconductor layer sequence can have as active regions in the active layer, for example, a conventional pn junction, a double heterostructure, a single quantum well structure (SQW structures) or a multiquantum well structure (MQW structures). Alongside the active layer having the active region, the semiconductor layer sequence can comprise further functional layers and functional regions, for instance, p- or n-doped charge carrier transport layers, p- or n-doped confinement, cladding or waveguide layers, barrier layers, planarization layers, buffer layers, protective layers and/or electrodes and combinations thereof. The electrodes can in this case each have one or more metal layers comprising Ag, Au, Sn, Ti, Pt, Pd, Rh and/or Ni. Such structures concerning the active layer or the further functional layers and regions are known to the person skilled in the art in particular with regard to construction, function and structure and, therefore, will not be explained in greater detail at this juncture.

Furthermore, additional layers, for instance buffer layers, barrier layers and/or protective layers, can also be arranged perpendicular to the growth direction of the semiconductor layer sequence, for example, around the semiconductor layer sequence, that is to say for instance on the side faces of the semiconductor layer sequence.

In accordance with a further embodiment, the laser light source has a ridge waveguide structure. For this purpose, at least one or a plurality of functional layers of the semiconductor layer sequence are structured in such a way that the at least one or the plurality of layers form a ridge extending in a direction, the ridge extension direction, parallel to the main extension plane of the functional layers. In particular, such a configuration of the semiconductor layer sequence, which configuration can also be designated as "ridge structure," can be suitable, dependent on its width and height and as a result of the so-called index guiding on account of the ridge-shaped structure and a sudden change in refractive index associated therewith, for making it possible to form a transverse fundamental mode in the active region. The ridge can extend in particular from the radiation coupling-out area as far as the side face of the semiconductor layer sequence situated opposite the radiation coupling-out area.

In order the produce the ridge waveguide structure, for example, the semiconductor layer sequence having the abovementioned functional layers and the active region can be provided. The ridge can be produced by a mask by means of an eroding method, for instance etching, on a main surface of the semiconductor layer sequence that is arranged parallel to the main extension plane of the functional layers. In this case, the width of the ridge can be adjustable by means of a mask that can be produced photolithographically.

In accordance with a further embodiment, the semiconductor layer sequence has a mode filter structure. The mode filter structure can be suitable, in particular, for damping higher modes that can occur alongside a fundamental mode in the laser light source.

In accordance with a further embodiment, the mode filter structure is embodied as part of the ridge and/or embodied along a main extension plane of the functional layers alongside the ridge and/or embodied perpendicular to a main extension plane of the functional layers below the ridge. In this case, the mode filter structure can have one or more of the elements, features and/or embodiments described below.

In accordance with a further embodiment, the ridge has a horizontal ridge width perpendicular to the ridge extension direction and parallel to the main extension plane of the functional layers. Perpendicular to the main extension plane of the functional layers and perpendicular to the ridge extension direction, the ridge can have a vertical ridge width. In this case, in other words, the horizontal ridge width can be the width of the ridge which the ridge has in a plan view of the top side of the laser light source with the ridge. The vertical ridge width can be the width of the ridge which the ridge has in a section perpendicular to the main extension planes of the functional layers and perpendicular to the ridge extension direction. The ridge can have, in particular, as the mode filter structure, a varying horizontal ridge width and/or a varying vertical ridge width.

In accordance with a further embodiment, the horizontal ridge width has at least one thickening and/or a constriction. That can mean, in particular, that the horizontal ridge width, along the ridge extension direction, increases and then decreases again, in order to form a thickening and/or decreases and then increases again, in order to form a constriction. In this case, the at least one thickening and/or constriction can be embodied as a bend or step in the horizontal ridge width, or else as a continuously varying ridge width.

By means of a widening of the ridge in the form of one or more thickenings of the horizontal ridge width, at one or more locations it is possible to enlarge the contact area of the ridge on the functional layer or partial layer on which the ridge is directly arranged and which is directly adjoined by the ridge, and/or the contact area of an electrode layer on the ridge with respect to the ridge or with respect to the functional layers, as a result of which the operating voltage of the laser light source can be reduced and the efficiency can thus be improved. In particular, by means of a continuous change in the varying horizontal ridge width, it is possible to reduce or completely prevent losses in the laser light source which can occur in the case of abrupt changes in the ridge width. Fluid transitions may be particularly preferred in this case, such as can be obtained, for example, by variations of exponential functions, sine, cosine, tangent and/or Gaussian curves and combination thereof.

In accordance with a further embodiment, the ridge has a varying horizontal ridge width having at least one thickening and/or a constriction, wherein the horizontal ridge width at at least one location can be narrower than the so-called cut-off width for achieving single-mode operation. The width can be calculated using the known relationship:

$$d=\lambda/[2(n_2^2-n_1^2)^{1/2}]$$

where d is the horizontal ridge width at said location, $n_2$ is the effective refractive index below the ridge in the semiconductor layer sequence, and $n_1$ is the effective refractive index alongside the ridge.

In accordance with a further embodiment, the ridge has a ridge width which is in the range of 0.3 µm to 200 µm inclusive, preferably in the range of 0.5 µm to 10 µm inclusive, and particularly preferably in the range of 0.8 µm to 3 µm inclusive.

In accordance with a further embodiment, the ridge has a thickening with regard to its horizontal ridge width near or at the radiation coupling-out area and/or the side face of the semiconductor layer sequence situated opposite the radiation coupling-out area. As a result, it is possible to reduce the power density directly at the radiation coupling-out area, as a result of which higher output powers can be achieved without the radiation coupling-out area of the laser light source being destroyed (COMD: "catastrophic optical mirror damage"). As an alternative thereto, the ridge can have a thickening of the horizontal ridge width between the radiation coupling-out area and the side face of the semiconductor layer sequence situated opposite the radiation coupling-out area, while at the radiation coupling-out area or the side face situated opposite the radiation coupling-out area, the horizontal ridge width has a constriction or tapering. A wider lateral far field can be generated as a result.

By means of a ridge having a varying ridge width having at least one thickening and/or a constriction, a combination of the advantages of a narrow ridge and of a wide ridge can be achieved, wherein a low aspect ratio of the emitted laser beam and a pronounced monomode guidance can be achieved by means of a narrow ridge or the narrow ridge regions, while the electrical contact can be improved by means of a wide ridge or the wide ridge regions, as a result of which the operating voltage can be reduced.

In accordance with a further embodiment, the vertical ridge width has a constriction. In this case, the constriction can encompass, for example, the active region or at least one functional layer above the active region. That can mean that the constriction of the vertical ridge width is arranged in the region of the active layer having the active region or thereabove. By virtue of the fact that, as a result of the constriction, an upper part of the ridge is wider than the lower part, which is more relevant to the wave guidance, it is possible to produce a larger contact area of the semiconductor layer sequence with respect to an electrode layer applied thereto.

What can thereby be achieved, in particular, is that the voltage for operating the laser light source can be reduced, as a result of which the efficiency increases. This can be advantageous in particular for a laser light source having a semiconductor layer sequence based on a nitride compound semiconductor material, since, in the case of this material in particular, the contact resistances with p-doped semiconductor layers are high in comparison with other material systems.

In accordance with a further embodiment, the ridge has, as the mode filter structure, a varying ridge height perpendicular to a main extension plane of the functional layers. In particular, that can mean that the ridge height varies along the ridge extension direction. Regions in which the ridge has a high ridge height, that is to say in which that part of the semiconductor layer sequence which adjoins the ridge has a depression, can bring about a reduction of the current spreading and a better overlap of the optical mode with the electrically pumped region, as a result of which a lower laser threshold and thus a good efficiency can be achieved. Regions having a smaller ridge height, that is to say regions of the semiconductor layer sequence or of that part of the semiconductor layer sequence which adjoins the ridge, which regions have an elevation in comparison with other parts, can provide for a weaker wave guidance, such that higher modes experience greater losses and can thus be damped or, particularly preferably, can no longer be guided at all. The transitions between regions having a high ridge height and regions having a small ridge height can be embodied in an abrupt fashion, that is to say, in particular, in a stepped fashion or in the form of bends, in the height profile of that part of the semiconductor layer sequence which adjoins the ridge. As an alternative thereto, the ridge height can also vary continuously along the ridge extension direction.

In accordance with a further embodiment, the ridge has ridge side faces which delimit the ridge in a direction perpendicular to the ridge extension direction and run along the ridge extension direction. In this case, the ridge can have, as the mode filter structure, at least partly or along the entire ridge, different ridge heights for the two side faces. As a result of such an asymmetrical embodiment of the ridge heights at the ridge side faces, an asymmetrical wave guidance can be produced, which particularly preferably can guide only one mode. As a result of the higher ridge height on one side of the ridge, it is possible to reduce the current spreading on this side, which can lead to an increase in the efficiency whilst at the same time maintaining the monomode nature. In addition, the ridge height can vary on one or both ridge side faces along the ridge extension direction.

In accordance with a further embodiment, a passivation is arranged alongside the ridge as the mode filter structure, said passivation varying along the ridge extension direction. That can mean, in particular, that the passivation is embodied as a passivation layer which varies, for example, with regard to its composition and/or its material along the ridge extension direction. As a result of the varying passivation along the ridge, it is possible to achieve a variation of the refractive index along the ridge, wherein a region having a lower refractive index can have the same effect as an increase in the ridge height. In particular, the passivation can vary continuously with regard to its composition and/or its material and in particular with regard to its refractive index. That can be achieved for example by means of two passivation layers, of which one passivation layer becomes thinner along the ridge extension direction and a second passivation layer applied thereto becomes thicker. In particular, the passivation can directly adjoin the ridge at at least one ridge side face. Particularly preferably, a passivation is arranged in the manner adjoining both ridge side faces.

In accordance with a further embodiment, the laser light source has different passivations as the mode filter structure at the two ridge side faces alongside the ridge, said passivations having different refractive indices, for example. It is thereby possible to achieve an effect similar to that as described above for different ridge heights at the ridge side faces.

In accordance with a further embodiment, the ridge has, as the mode filter structure, a curved ridge extension direction. A curved ridge extension direction can be recognizable by a curved course of the ridge in a plan view of the ridge. That can mean, in particular, that the ridge is not embodied exclusively mirror-symmetrically with respect to the optical axis of the laser light source. The optical axis can be provided in particular by that direction in the semiconductor layer sequence, in particular in the active region, along which the laser radiation is formed. The emission direction, in which the laser light is emitted from the radiation coupling-out area by the laser light source, can be an extension of the optical axis.

In accordance with a further embodiment, the ridge side faces of a ridge having a curved ridge extension direction are parallel or at least approximately parallel. As a result, the processability can be simplified and/or the reproducibility from laser light source to laser light source can be increased.

In accordance with a further embodiment, the ridge has a curved ridge extension direction formed by at least one bend in the ridge and/or at least one continuous change in the direction of the ridge relative to the optical axis. In this case, the at least one bend or the at least one continuous change in direction can be provided by a defined angle.

A curved ridge extension direction can enable greater damping of higher modes in the active region, wherein in this case a single-mode behavior can be obtained even in the case of a ridge width that is greater than the cut-off ridge width described above.

In accordance with a further embodiment, as the mode filter structure, it is possible to combine a curved ridge extension direction with a varying passivation along the ridge extension direction and/or on the two ridge side faces. A curved ridge can have an asymmetrical far field, depending on the curvature. To compensate for this, in the case of a curved ridge extension direction, in particular in the case of a bent, curve-shaped ridge extension direction having one or a plurality of curves, a passivation can be arranged at one or a plurality of inner curves, which passivation has a higher absorption than a passivation at the corresponding outer curve. As a result, the phase of the optical mode can be influenced such that a symmetrical emission profile or far field is generated.

In accordance with a further embodiment, the ridge is delimited by two ridge side faces running along the ridge extension direction, wherein, as the mode filter structure, at least one partial region of a ridge side face has an oxidation. That can mean, in particular, that at least one partial region of a ridge side face, preferably one ridge side face and particularly preferably both ridge side faces, are oxidized at least in partial regions. For this purpose, the ridge can have at least one aluminum-containing layer whose side faces, which form a partial region of the ridge side faces, are oxidized.

In accordance with a further embodiment, the ridge adjoins a functional layer of the semiconductor layer sequence which comprises, as the mode filter structure, a conductivity-changing and/or a light-absorbing material. Such a material, which can be, for example, a dopant such as silicon, for instance, an electrically insulating substance such as hydrogen, for instance, or a light-absorbing substance such as germanium, for instance, can be introduced by implantation and/or diffusion at least into partial regions of the functional layer adjoining the ridge. Such regions can serve as current and/or mode diaphragms which can damp higher modes by a lateral current limitation and/or a corresponding wave guidance.

In accordance with a further embodiment, the semiconductor layer sequence has at least one functional layer as the mode filter structure, which has at least partly a damaged structure alongside the ridge and/or below the ridge. A damaged structure can be effected after the growth of the semiconductor layer sequence and the formation of the ridge, for example, by at least partial evaporation of semiconductor material of the semiconductor layer sequence in at least one functional layer. The evaporation can be achieved, for example, by irradiating the semiconductor layer sequence with laser radiation, in particular short-pulse laser radiation, by means of which, with corresponding focusing, the semiconductor material can be damaged in targeted regions. In particular, the laser radiation can be chosen in such a way that a component, for example, the group V material in the case of a group III-V compound semiconductor material at least partly evaporates. In this case, the damaged region can be formed in a manner directly adjoining the ridge in a functional layer. Additionally or alternatively, the semiconductor layer sequence can have a damaged region below and/or laterally offset alongside the ridge and below the ridge, for example, on a side of the active region which faces away from the ridge. A current and/or mode diaphragm can likewise be achieved by means of such a damaged region.

In accordance with a further embodiment, the laser light source has, as the mode filter structure, at least two of the abovementioned mode filter structure features and/or embodiments. That can mean, in particular, that the laser light source has, as the mode filter structure, a varying ridge width and/or a varying ridge height and/or a varying passivation along the ridge extension direction. That can also mean that the ridge additionally or alternatively has, as the mode filter structure, a curved ridge extension direction and/or implanted or doped regions and/or damaged regions.

The embodiments of the mode filter structure mentioned here can make it possible to set the mode profile of the laser light source optimally to a high efficiency, a desired far field width and also to a monomode nature.

BRIEF DESCRIPTION OF THE DRAWINGS

Further advantages and advantageous embodiments and developments of the invention will become apparent from the embodiments described below in conjunction with the figures.

FIGS. 1A to 1C show schematic illustrations of laser light sources having a ridge waveguide structure;

FIGS. 2A to 2N show schematic illustrations of laser light sources having a varying horizontal ridge width in accordance with a plurality of exemplary embodiments;

FIGS. 3A to 3M show schematic illustrations of laser light sources having curved ridge extension directions in accordance with further exemplary embodiments;

Figure 3I:
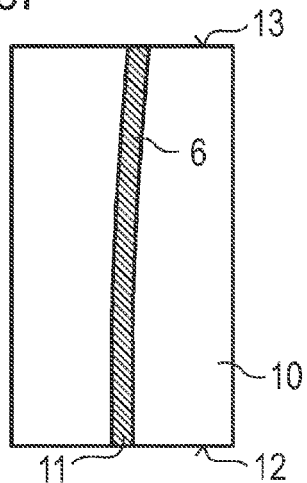

In the exemplary embodiments and figures, identical or identically acting constituent parts may in each case be provided with the same reference signs. The illustrated elements and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

DETAILED DESCRIPTION OF ILLUSTRATIVE EMBODIMENTS

In order to describe the basic features of a laser light source having a ridge waveguide structure, FIG. 1A shows a schematic three-dimensional illustration of a laser light source having a ridge waveguide structure such as is known from the prior art. In particular, the known ridge waveguide structure is formed by a ridge 11 having a constant ridge height 110 and a constant ridge width 113 along the rectilinear ridge extension direction AA shown.

The laser light source comprises a semiconductor layer sequence 10 having a substrate 1, on which a plurality of functional, epitaxially grown layers 4 are applied. In this case, the functional layers 4 each have a main extension plane perpendicular to the arrangement direction of the functional layers. In the example shown, the semiconductor layer sequence 10 is based on an InGaAlN compound semiconductor material as described above in the general part. The functional layers 4 are embodied as n- and p-doped cladding layers 41, 44 and waveguide layers 42, 43 and also as an active layer 40 having an active region 45. The active layer 40 can be embodied for example as a multiquantum well structure having one to five quantum films arranged between barrier layers. Furthermore, even further functional layers such as, for instance, one or more contact layers and/or intermediate layers can be present in addition to the functional layers shown.

As an alternative to the nitride-based semiconductor material described here, the semiconductor layer sequence 10 can also comprise phosphide- and arsenide-based semiconductor materials, for example.

The substrate 1 can be a growth substrate, on which the functional layers 4 are grown epitaxially. As an alternative thereto, the semiconductor layer sequence 10 can be producible using thin-film technology. That means that the functional layers 4 are grown on a growth substrate and subsequently transferred to a carrier substrate, which then forms the substrate 1 of the semiconductor layer sequence 10. Depending on the growth technique, in this case the n-conducting layers or the p-conducting layers of the semiconductor layer sequence 10 can face the substrate 1.

In the exemplary embodiment shown, the electrical contact-connection of the semiconductor layer sequence 10 is effected via an electrode 2 on the underside of the substrate 1, facing away from the functional layers 4, and via an electrode 3 on the top side of the semiconductor layer sequence 10 opposite the substrate 1. In this case, the electrodes 2 and 3 can each have one or a plurality of metal layers, for example, comprising Ag, Au, Sn, Ti, Pt, Pd, Rh and/or Ni.

As an alternative to the electrical contact-connection through the substrate 1, the electrical contact 2 can also be arranged on the same side of the substrate 1 as the functional layers 4 and alongside the active layer 40. This type of contact-connection is primarily suitable for making electrical contact with the functional layers 4 on the substrate side if they are arranged on an electrically non-conductive substrate 1.

Furthermore, the semiconductor layer sequence 10 has a radiation coupling-out area 12 and, opposite the latter, a side face 13 embodied as a rear side, which each have an at least partly reflective coating (not shown). As a result, the radiation coupling-out area 12 and the rear-side side face 13 form an optical resonator. The respective at least partly reflective coating can comprise or be composed of a Bragg mirror layer sequence and/or reflective metal layers, for example.

Furthermore, passivation layers for protecting the semiconductor layer sequence can be applied on or above surfaces of the semiconductor layer sequence 10 (not shown).

In the exemplary embodiment shown, the cladding layer 44 arranged on the top side of the active layer 40 remote from the substrate 1 is embodied partly as the ridge 11 and forms a so-called ridge waveguide structure or "ridge" structure as described in the general part. Alternatively, the ridge 11 can also be embodied as part of further functional layers 4. The ridge 11 has ridge side faces 111, 112 which run along the ridge extension direction AA and delimit the ridge 11 in a direction parallel to the main extension plane of the functional layers 4 and perpendicular to the ridge extension direction AA. The ridge waveguide structure having the ridge 11 is produced by means of etching after the production of the semiconductor layer sequence 10 by the application of the functional layer 4 on the substrate 1. For this purpose, the semiconductor layer sequence 10 can also have, for example, a functional layer embodied as an etching stop layer. The ridge height 110 thus corresponds to the etching depth during the formation of the ridge 11.

As an alternative to the production of the ridge 11 by means of etching, said ridge can also be grown by means of selective growth as part of the semiconductor layer sequence 10.

By means of the ridge waveguide structure having the ridge 11, the formation of laser light can be made possible in the active layer 40, whereas undesired further laser modes can be suppressed to a certain degree in comparison with ridgeless laser light sources. In particular, the active layer 40 has the active region 45, which is predefined, inter alia, by the width of the ridge 11, and in the exemplary embodiment shown, is indicated by the hatched area in the active layer 40. In this case, the active region 45 extends over the entire length of the active layer 40 in the resonator formed by the radiation coupling-out area 12 and the rear-side side face 13. In the active region 45, the semiconductor layer sequence 10 can generate laser light by stimulated emission during operation, which laser light can be emitted via the radiation coupling-out area 12.

Alongside the ridge extension direction AA, for the description of the following exemplary embodiments, a vertical sectional plane BB through the semiconductor layer sequence 10 and also a viewing direction CC as a plan view of the semiconductor layer sequence 10 and in particular the ridge waveguide structure having the ridge 11 are furthermore indicated.

FIGS. 1B and 1C show schematic sectional illustrations of laser light sources along the vertical sectional plane BB from FIG. 1A. The semiconductor layer sequences 10 of the laser light sources in FIGS. 1B and 1C can be embodied, for example, like the semiconductor layer sequence in accordance with the exemplary embodiment in FIG. 1A. In addition, the laser light sources in FIGS. 1B and 1C comprise a passivation 5 arranged alongside the ridge 11. The passivation 5 can be provided, for example, for electrical insulation, for protection of the ridge and the semiconductor layer sequence 10, for facilitated application of the electrode 3 and/or for adaptation of the sudden change in refractive index at the ridge 11 or at the semiconductor layer sequence 10. While the ridge 11 is embodied as a self-supporting ridge in FIG. 1B and also in FIG. 1A, the laser light source in FIG. 1C has a so-called "tripod" structure, in which the semiconductor material of the semiconductor layer sequence 10 is removed on the right and left alongside the ridge 11 only in a narrow trench and not over the whole area. This can afford better protection against scratches and/or mechanical loadings of the ridge 11.

Furthermore, it is also possible for the ridge 11 to be formed as a so-called buried heterostructure. In this case, after the ridge has been formed, it is epitaxially overgrown with further semiconductor layers.

The following exemplary embodiments describe variants according to the invention of the known embodiments—shown in FIGS. 1A to 1C—of laser light sources having ridge waveguide structures, which have mode filter structures 6 in comparison with the known laser light sources in FIGS. 1A to 1C. Alongside the respectively shown embodiment of the following exemplary embodiments, the latter can also be formed in a tripod structure or as a buried heterostructure.

FIGS. 2A to 3M hereinafter show plan views of semiconductor layer sequences 10 of laser light sources in accordance with a plurality of exemplary embodiments, wherein the plan views in each case correspond to the viewing direction CC in FIG. 1A.

FIGS. 2A to 2L show laser light sources semiconductor with layer sequences 10 having ridges 11 which have, as the mode filter structure 6, parallel to the main extension plane of the functional layers and perpendicular to the ridge extension direction AA, a varying horizontal ridge width 113, 113', 113" as indicated in FIGS. 2A and 2D. In particular, the horizontal ridge width in the respectively shown plan view of the semiconductor layer sequence 10 varies along the ridge extension direction AA indicated in FIGS. 2A and 2D.

In particular, the ridges 11 of the laser light source of the exemplary embodiments in accordance with FIGS. 2A to 2L have, as a result of the varying horizontal ridge width as the mode filter structure 6, thickenings 61 and/or constrictions 62, which make it possible to achieve an improved efficiency and/or a better beam quality in comparison with known laser light sources having ridge waveguide structures having a constant ridge width. Thus, as a result of a widening of the ridge width in the form of the thickenings 61 at one or a plurality of locations, the contact area for feeding current into the active layer can be enlarged, as a result of which the operating voltage can be reduced and the efficiency can thus be improved. In this case, as shown, for example, in FIG. 2A, the thickening 61 or widening of the ridge width 113, 113' can be implemented in an abrupt fashion, that is to say in a stepped fashion. Preferably, the thickening 61 or else the constriction 62 can be formed by a continuous or at least partly continuous transition of the ridge width, for example, by means of a linear form, as is shown in FIG. 2B, or by means of circular and/or elliptical forms, as is shown for example in FIG. 2C. Furthermore, it can be particularly advantageous if the horizontal ridge width 113, 113', 113" varies in the form of continuous transitions, such as can be obtained, for example, by variations of exponential functions, sine, cosine, tangent and/or Gaussian curves and combination thereof, as is shown in FIGS. 2D to 2L. As a result of such a continuous transition, it is possible to reduce or even completely prevent losses in the laser light source which could occur in the case of overly abrupt changes in the ridge width.

In this case, the mode filter structures 6 of the exemplary embodiments in FIGS. 2A to 2L are embodied axially symmetrically with respect to the ridge extension direction AA, which also corresponds in each case to the optical axis of the laser light sources.

FIGS. 2M and 2N show two exemplary embodiments of mode filter structures 6 having ridge width changes embodied asymmetrically with respect to the optical axis of the laser light source. Purely by way of example, these are embodied in the form of the thickenings 61 of the horizontal ridge width in FIGS. 2M and 2N. As a result of the asymmetrical form of the ridge, or form of the ridge that is not symmetrical with respect to the optical axis, higher modes can advantageously be suppressed since they are damped at the irregularities of the ridge width to a greater extent that the fundamental mode.

As an alternative to the number of thickenings 61 and/or constrictions 62 shown in each case in the exemplary embodiments, more thickenings 61 and/or constrictions 62 can also be present. In particular, the shown forms of the thickenings 61 and/or 62 of the various exemplary embodiments can also be combined with one another.

Particularly preferably, the horizontal ridge width 113 in each case at the narrowest location is preferably smaller than the cut-off ridge width described in the general part for fulfilling the condition of the monomode nature. At other locations, the ridge 11 can in each case also be wider than the cut-off ridge width.

Depending on the desired emission angle, the at least one thickening 61 and/or the at least one constriction 62 can be arranged near the facets, that is to say near the radiation coupling-out area 12 and/or the rear-side side face 13 situated opposite the radiation coupling-out area and/or rather in the inner part of the ridge 11 along the ridge extension direction AA. A widening 61 of the ridge 11 toward the facets, as shown for example in FIGS. 2F, 2K and 2L, additionally has the advantage that the power density is reduced directly at the facet. As a result, higher output powers can be achieved without the facets, that is to say in particular, the radiation coupling-out area 12, of the laser light source being destroyed. If a rather wider lateral far field is desired, it can be advantageous, by contrast, if the horizontal ridge width is shaped rather narrowly in the facet region, as is shown, for example, in FIGS. 2A to 2E and 2G to 2J.

In order to simplify the processability and to increase the reproducibility of different laser light sources embodied in an identical way, it is advantageous if the edges and thus the side faces of the ridge 11 in the facet region preferably run at least approximately parallel, as is shown in FIGS. 2A to 2E, 2H, 2I and 2J.

FIGS. 3A to 3H show laser light sources which each comprise a ridge 11 having, as the mode filter structure 6, a curved ridge extension direction A, AA', AA", as is shown by way of example in FIG. 3A. As a result, the ridge in the exemplary embodiments shown in FIGS. 3A to 3I is chosen such that it is not mirror-symmetrical with respect to the optical axis, which, despite the varying ridge extension direction, in the exemplary embodiments in FIGS. 3A to 3I, is embodied in a rectilinear fashion between the radiation coupling-out area 12 and the rear-side side face 13. As a result of such curved ridge forms, higher modes can be damped to an intensified extent in comparison with the fundamental mode, wherein in this case the minimum ridge width can also be wider than the abovementioned cut-off ridge width, in order still to be able to obtain a single-mode behavior.

As is shown in FIG. 3A, the ridge 11 can have bends having defined angles, such that the ridge extension direction A, AA', AA" can change abruptly. As is shown in the exemplary embodiments in FIGS. 3B to 3I, the ridge extension direction can also vary continuously, as a result of which losses can be avoided in comparison with an overly abrupt change in the ridge extension direction.

Particularly preferably, the ridge side faces, in the region of the facets 12, 13, are embodied as perpendicular or at least approximately perpendicular thereto. In this case, as is shown in FIGS. 3A and 3B, the positions of the ridge 11 at the facets 12, 13 can be offset with respect to one another. As is shown in FIGS. 3C to 3H, the positions of the ridge 11 at the facets 12, 13, as also in the case of a rectilinear ridge, can overlap one another in a projection along the optical axis, while the ridge 11 between the facets 12, 13 varies relative to the ridge ends at the facets 12, 13. In this case, as is shown in FIG. 3I, the ridge extension direction can have one direction change or else, as is shown in FIGS. 3A and 3B, two direction changes, which succeed one another abruptly in accordance with FIG. 3A and merge continuously and gradually into one another in accordance with FIGS. 3B and 3I. FIGS. 3C to 3H show ridges having mode filter structures 6 which are formed by a plurality of direction changes of the ridge extension direction. An intensified damping of higher modes can thereby be achieved. As is shown in FIGS. 3F to 3I, the varying ridge extension directions can additionally be combined with thickenings 61 or constrictions 62 of the horizontal ridge width.

Figure 3J:
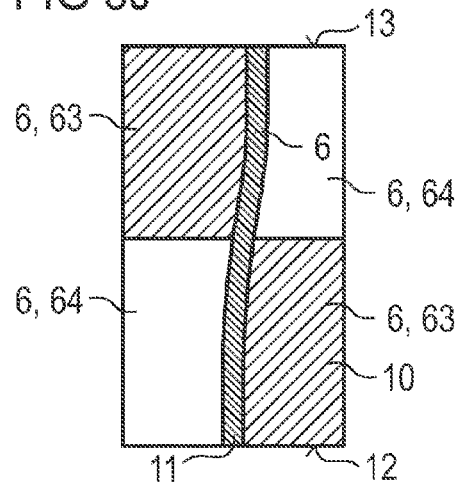
Figure 3K:
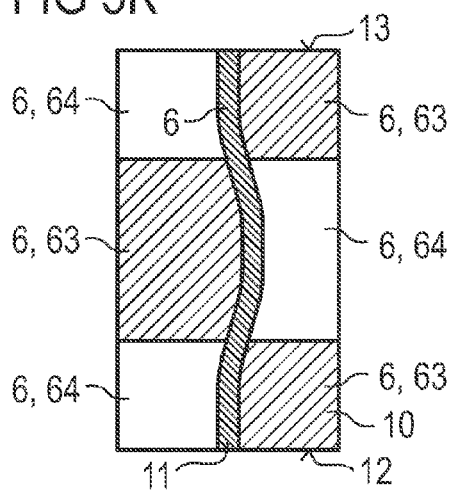

FIGS. 3J and 3K show further exemplary embodiments of mode filter structures 6 with a curved ridge extension direction, which, purely by way of example, are curve-shaped like the ridges 11 of the exemplary embodiments in FIGS. 3B and 3C. As a result of the ridge curvature, the laser light sources of the exemplary embodiments shown can have an asymmetrical far field. The latter can be compensated for by a respective passivation 63 as a further part of the mode filter structure 6 being arranged at the inner curves of the curved ridges 11, said passivation having a greater absorption in comparison with the passivation 64 at the outer curves. As a result, the phase of the mode propagating in the semiconductor layer sequence 10 can be influenced such that a symmetrical emission profile or far field is generated.

Figure 3L:
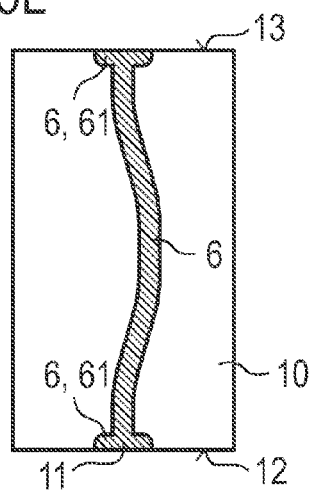
Figure 3M:
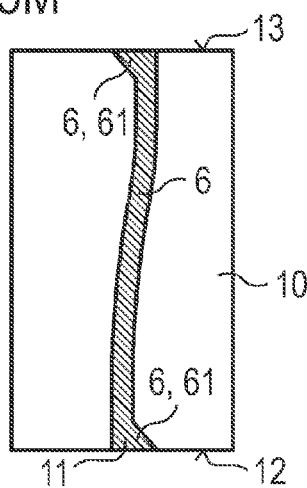

FIGS. 3L and 3M show further exemplary embodiments of mode filter structures 6 having a curved ridge extension direction, which additionally also have thickenings 61 at the facets, that is to say the radiation coupling-out area 12 and the side face 13 situated opposite the radiation coupling-out area. As a result, the power density can be reduced directly at the facets, in particular at the radiation coupling-out area 12, as a result of which facet damage at high optical powers (COMD) can be prevented.

As shown in FIG. 3L, the widening of the horizontal ridge width in the form of thickenings 61 can be symmetrical with respect to the ridge 11 at the facets. However, it is also possible that, as is shown in FIG. 3M, the thickenings 61 are asymmetrical with respect to the ridge 11 at the facets, as a result of which the emission angle of the laser light source can additionally also be influenced.

FIGS. 4A to 8B illustrate schematic three-dimensional illustrations of laser light sources having semiconductor layer sequences 10 in accordance with further exemplary embodiments, wherein features such as, for instance, electrodes and functional layers are not shown, for the sake of clarity.

The exemplary embodiments in accordance with FIGS. 4A to 5D comprise, as the mode filter structure 6, a ridge 11 having a varying ridge height 110, 110', 110" along the ridge extension direction AA perpendicular to the main extension plane of the functional layers. In this case, the varying ridge height is produced by unequal etching of the semiconductor layer sequence 10 for the production of the ridge 11, such that the varying ridge heights correspond to inhomogeneous ridge etching depths. In this case, more deeply etched regions, that is to say regions having a greater ridge height, bring about a reduction of the current spreading and a better overlap of the optical mode with the electrically pumped region. It is thereby possible to achieve lower laser thresholds and thus a good efficiency.

More shallowly etched regions, that is to say regions having a smaller ridge height, can provide for a weaker wave guidance, such that higher modes experience greater losses and are thus damped or are no longer guided at all.

As is shown in FIGS. 4A, 4D and 5A to 5D, the transitions between the varying ridge heights can be abrupt, for example bend-like. As an alternative thereto, the transitions in the respective etching depth and thus the transitions in the ridge heights can be designed in a continuous fashion, as is shown in FIGS. 4B and 4C, as a result of which losses in the fundamental mode can be avoided.

Figure 4A:
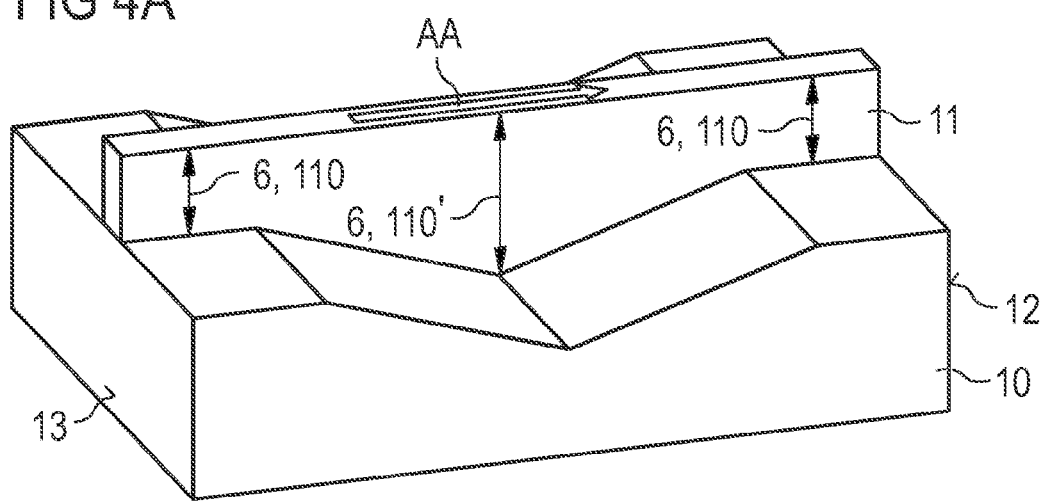
FIGS. 4A to 6 show schematic illustrations of laser light sources having varying ridge heights.
Figure 4B:
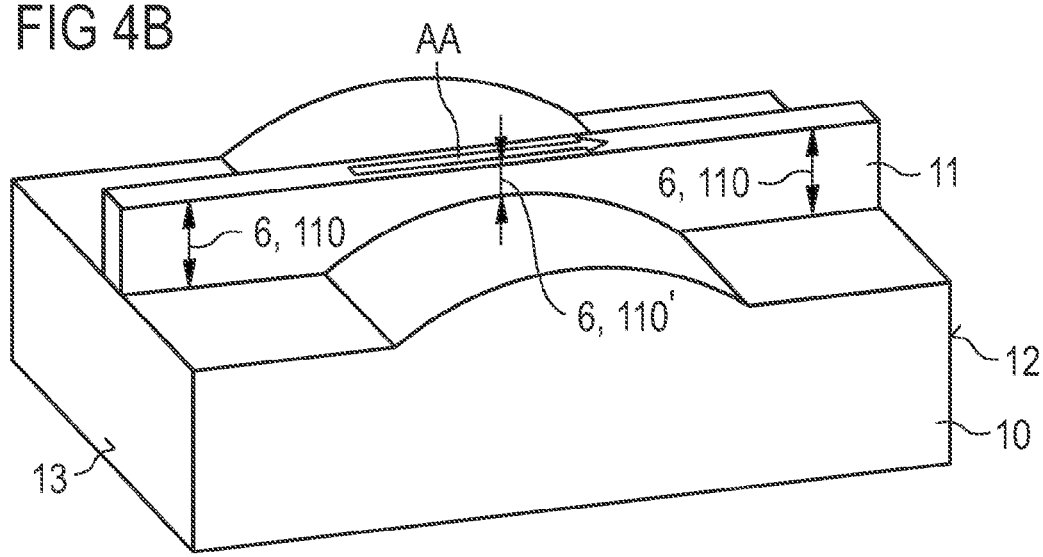
Figure 4C:
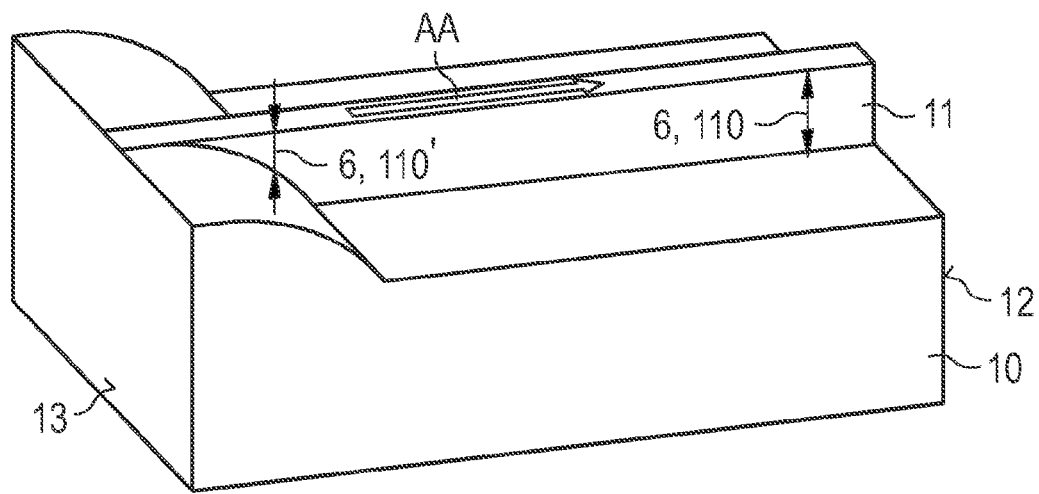

In the case of the exemplary embodiment shown in FIG. 4A, the ridge width and the variation of the ridge height 110, 110' are chosen such that only one mode is guided in the facet region, that is to say in particular in the region of the radiation coupling-out area 12. The more deeply etched regions reduce the current spreading and increase the lateral filling factor, as a result of which the laser performance can be improved.

In order to achieve wider lateral far fields and thus a lower aspect ratio between vertical and horizontal modes, the ridge can also be etched rather deeply in particular in the facet region 12, 13. In this case, it is then possible to arrange more shallowly etched regions having a smaller ridge height as the mode filter structure 6 in the center of the resonator formed by the facets 12, 13, that is to say the radiation coupling-out area 12 and the side face 13 situated opposite the radiation coupling-out area (see FIG. 4B), or at the end of the resonator at the side face 13 situated opposite the radiation coupling-out area 12 (see FIG. 4C).

Figure 4D:
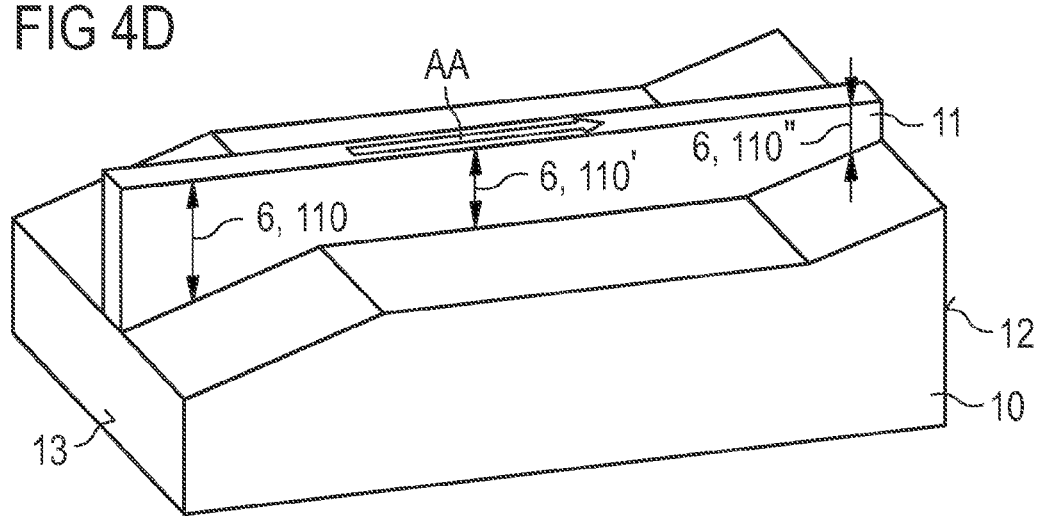

In order to set a smaller far field angle and/or in order to enable higher output powers, the ridge 11 can be etched more shallowly in the facet region, that is to say in particular in the region of the radiation coupling-out area 12, and thus have a smaller ridge height 110", as is shown in FIG. 4D. By inter-changing the radiation coupling-out area 12 and the side face 13 situated opposite the radiation coupling-out area 12, this can likewise apply to the exemplary embodiment in accordance with FIG. 4C.

As a result of the smaller ridge height, the optical mode spreads in this region. For higher modes, in particular, this results in additional high losses.

As is shown in conjunction with FIGS. 5A to 5D, the mode filter structure 6 can particularly preferably be combined by means of a varying horizontal ridge width with thickenings 61 or constrictions 62 with a varying ridge height 110, 110'.

A low aspect ratio of the emitted laser beam is fostered by narrow ridges near the radiation coupling-out area 12 and a strong wave guidance by means of a high ridge height. This can be combined in the central region with a larger ridge width which is index-guided to a lesser extent by means of a smaller ridge height, that is to say a shallower etching depth, as is shown in FIG. 5A.

Figure 5A:
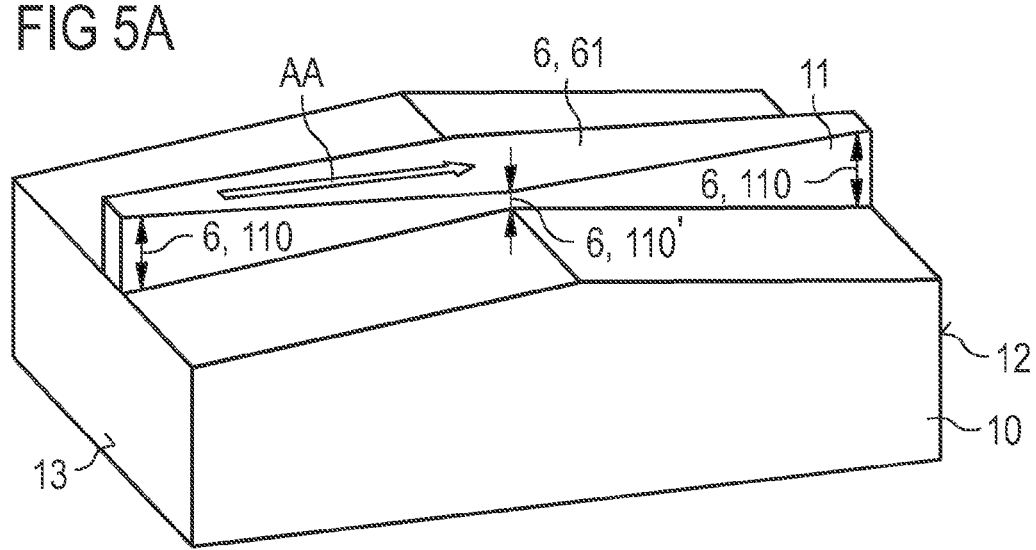

In particular, by way of example, the laser light sources of the exemplary embodiments in FIGS. 5A and 5C can be monomode over the entire ridge length because the strong wave guiding in the deeply etched regions with a large ridge height 110 is compensated for by correspondingly narrow horizontal ridge widths. It is thus possible to set the far field angle as necessary in a wide manner in accordance with the exemplary embodiment in FIG. 5A or in a narrow manner in accordance with the exemplary embodiment in accordance with FIG. 5C. Independently of the ridge width at the facets 12, 13, that is to say in particular at the radiation coupling-out area 12, it is furthermore also possible to obtain a lower operating voltage by means of a larger ridge width in the form of a thickening 61 in the center of the ridge 11 in accordance with FIG. 5A or a reduced current spreading by means of a constriction 62 of the horizontal ridge width in the center in accordance with the exemplary embodiment in accordance with FIG. 5C.

Figure 5B:
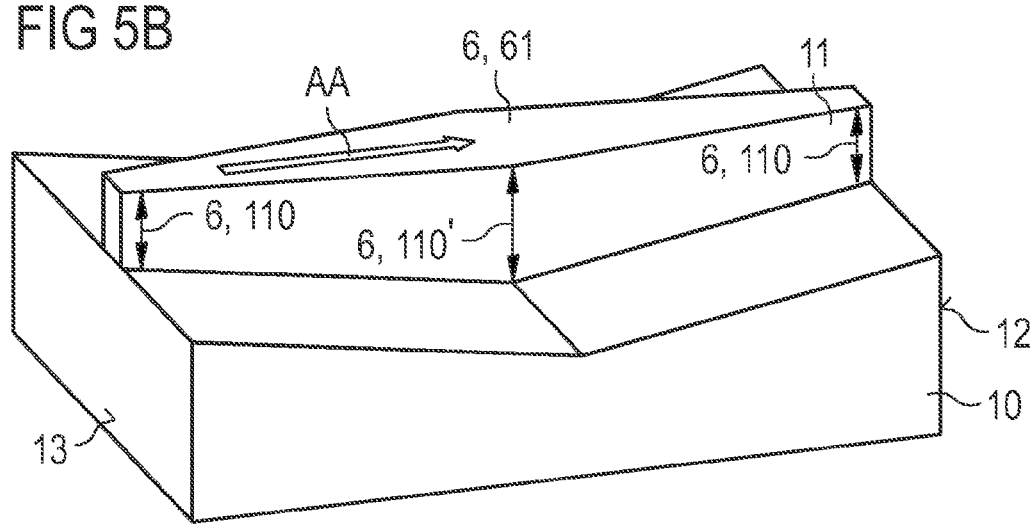

In accordance with the exemplary embodiment in FIG. 5B and the exemplary embodiment in FIG. 5D, however, the respective laser light source need not be monomode over the entire ridge length. In these exemplary embodiments, mode filter structures 6 are provided in accordance with the exemplary embodiment in FIG. 5B with the consequence of a wider far field or in accordance with the exemplary embodiment in FIG. 5D with the consequence of a narrower far field.

Figure 6:
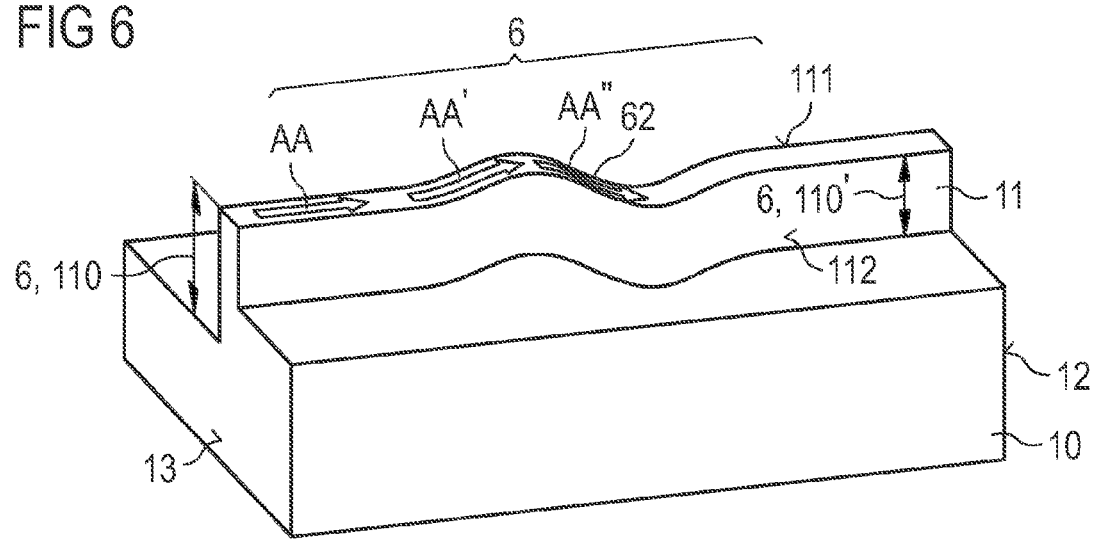

In accordance with the exemplary embodiment in FIG. 6, the ridge 11, as the mode filter structure 6, has different ridge heights 110 and 110' at the ridge side faces 111 and 112. As a result, an asymmetrical waveguide which can guide only one mode can be produced as a result of the asymmetrical etching depths and the resultant different ridge heights 110, 110' on the two ridge side faces 111, 112. At the same time, as a result of the deeper etching on one ridge side face 111 of the ridge 11 with the greater ridge height 110, the current spreading is reduced on this side, which leads to an increase in power whilst at the same time maintaining the monomode nature.

In addition to the different ridge heights 110, 110' on the two sides of the ridge 11, the ridge heights can also vary along the ridge extension direction AA. Furthermore, it is also possible that, for example as is shown in FIG. 6, in addition to the different ridge heights 110, 110' at the two ridge side faces 111, 112 of the ridge 11, the ridge extension direction AA, AA', AA" and/or the horizontal or vertical ridge width varies, as a result of which a combination of the effects and the advantages described can be achieved.

In the exemplary embodiments shown above, the wave guidance is made possible by a sudden change in refractive index between the semiconductor material of the semiconductor layer sequence and the environment, which is formed, for example, by air or a homogeneous passivation layer (not shown in the exemplary embodiments). In this case, a variation of the sudden change in refractive index is achieved by means of the varying or different ridge height. As is shown in conjunction with FIGS. 7 to 8B, such a variation of the sudden change in refractive index can also be achieved by means of a different passivation 63, 64 at the two ridge side faces 111, 112, or by means of a passivation 63, 64 that varies along the ridge extension direction AA.

Figure 7:
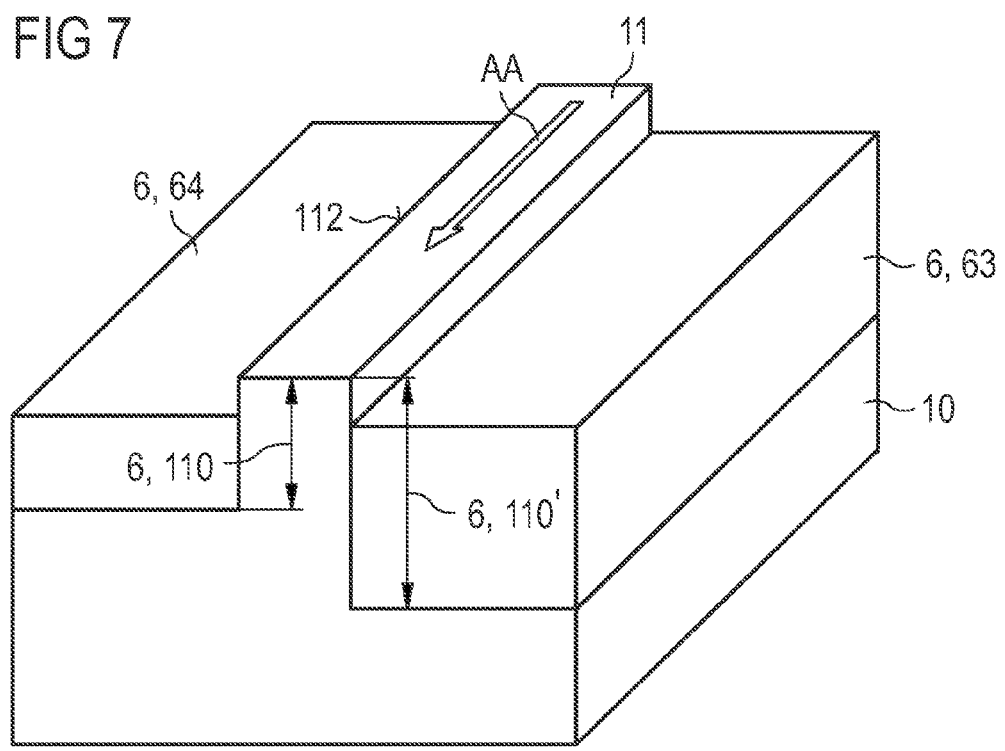
FIGS. 7 to 8B show schematic illustrations of laser light sources having varying passivations in accordance with further exemplary embodiments.

As is shown in FIG. 7, as the mode filter structure 6, it is possible to use different materials for the passivations 63, 64 on the two ridge side faces 111, 112, while independently thereof the desired sudden change in refractive index can be set as a further part of the mode filter structure 6 by means of different ridge heights 110, 110' at the ridge side faces 111, 112.

Figure 8A:
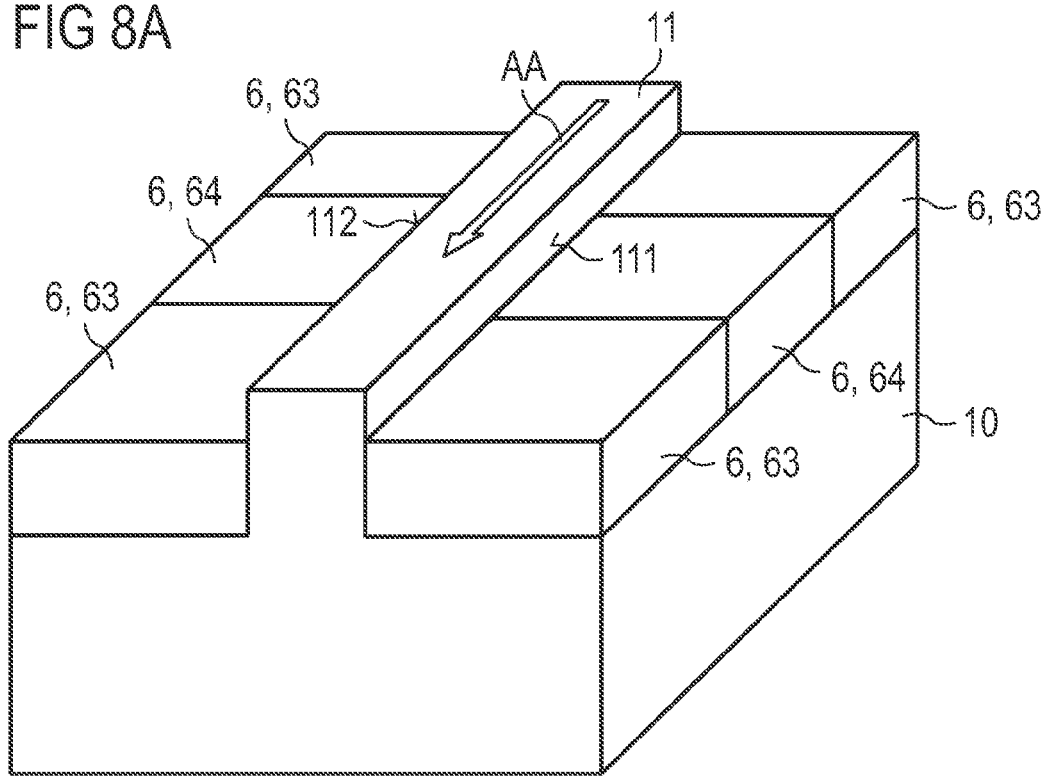
Figure 8B:
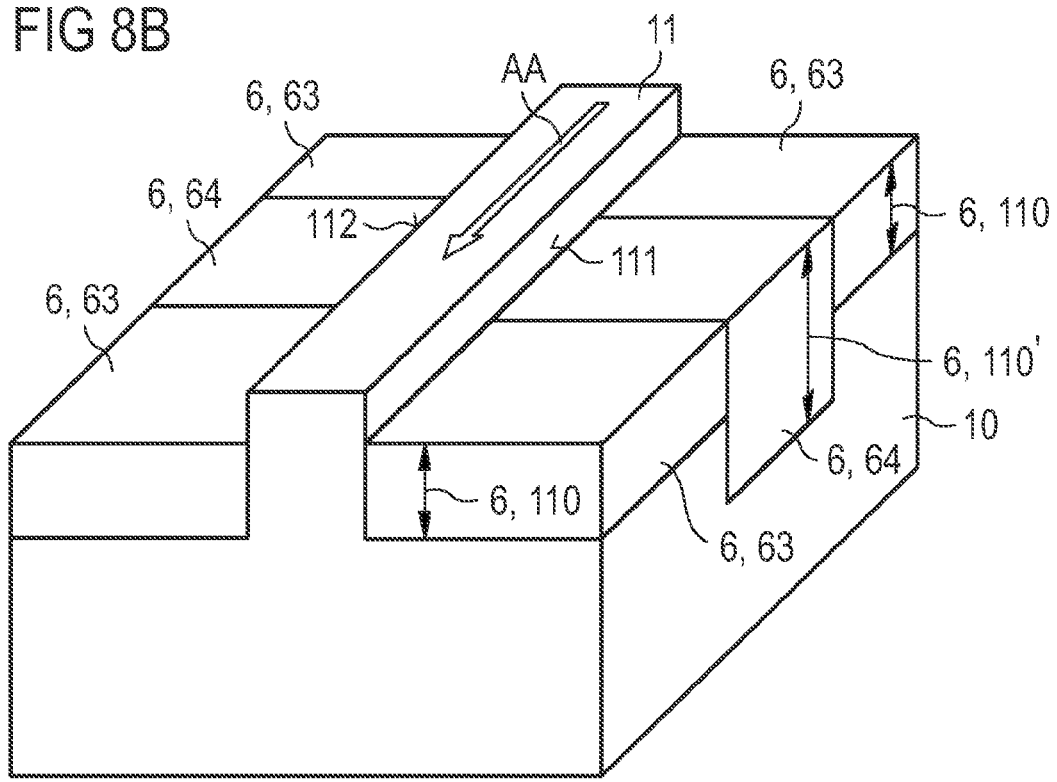

In the exemplary embodiment in accordance with FIG. 8A, the ridge 11 is passivated with a different material 64 in a central region than in the regions in proximity to the facets, in which the passivation material 63 is arranged. If the central part is passivated, for example, with a material having a lower refractive index than the remaining regions along the ridge extension direction AA of the ridge 11, then this has an effect such as in the case of a larger etching depth and a higher ridge height in this region. In this case, there is an abrupt transition between the passivations 63 and 64, as is shown in FIGS. 8A and 8B. As an alternative thereto, the transition between the passivations 63 and 64 can particularly preferably be chosen as a continuous transition. By way of example, one of the passivations 63, 64 can have a decreasing height, while the overlying further passivation 64 or 63 has an increasing height.

It is particularly advantageous to combine the formation of different ridge heights with the use of different passivation materials and/or different absorbent materials along the ridge 11. In the case of the ridge 11 in accordance with the exemplary embodiment in FIG. 8B, in which the passivation 64 in the more deeply etched region having the greater ridge height 110' is chosen differently than in the remaining region, this advantageously makes it possible, for example, to position an absorbent material selectively along the ridge 11, without the mode guidance being altered in this case. If a more greatly absorbent material 64 is used in the central region, for example, then higher modes can be damped because this material then also has a higher refractive index. By way of example, non-stoichiometric, silicon-rich $SiO_2$ or SiN can be used as such material for the passivation 64, while correspondingly stoichiometric $SiO_2$ or SiN is used as passivation 63. In order to keep the sudden change in refractive index constant along the ridge 11, the region passivated with the material 64 having a higher refractive index is etched correspondingly more deeply.

A combination of the mode filter structures 6 of the exemplary embodiments in accordance with FIGS. 6 to 8 can make it possible to set the mode profile optimally to a high efficiency, desired far field width and monomode nature.

FIGS. 9A to 10C show methods for producing laser light sources in accordance with further exemplary embodiments, which each have a varying vertical ridge width 113, 113' as the mode filter structure 6. In this case, the illustrations correspond to a section through the laser light source or the semiconductor layer sequence 10 in accordance with the sectional plane BB in FIG. 1A.

Figure 9A:
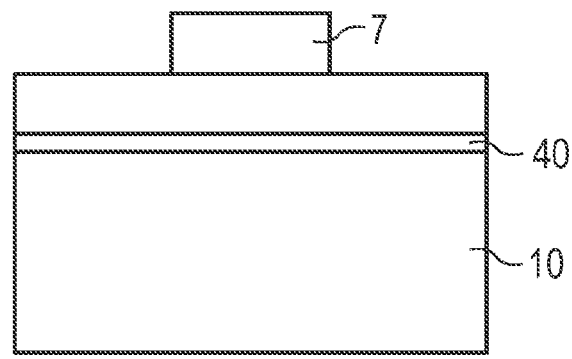
FIGS. 9A to 10C show schematic illustrations of laser light sources having varying vertical ridge widths.
Figure 9B:
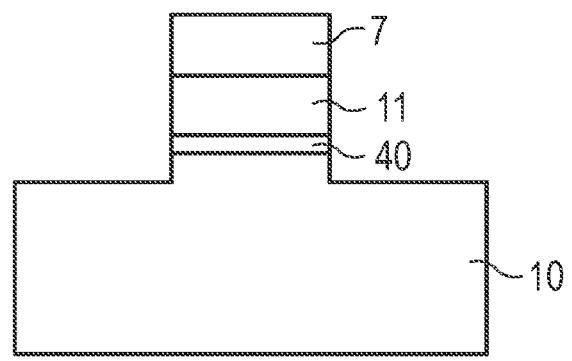
Figure 10A:
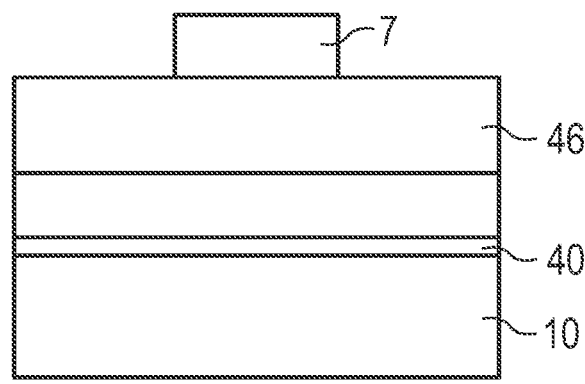

In both methods, in accordance with FIGS. 9A and 10A, a semiconductor layer sequence 10 is provided, in which, for the sake of clarity, only the active layer 40 is shown. A hard mask 7 as etching mask is applied on the semiconductor layer sequence 10, which mask, in the subsequent etching step in accordance with FIGS. 9B and 10B, defines the ridge width and also the course of the ridge, for example, with a varying or a rectilinear ridge extension direction. In this case, the ridge 11 is etched by means of a dry-chemical etching method.

Figure 9C:
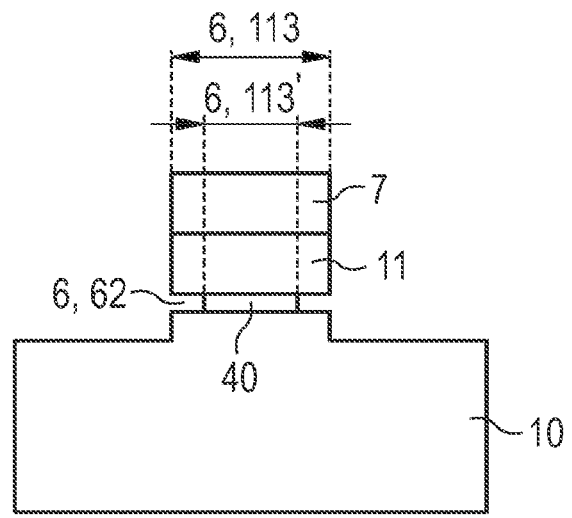

In the exemplary embodiment in accordance with FIGS. 9A to 9C, the ridge is produced by etching through the active layer 40, such that the latter forms a part of the ridge 11 and side faces of the active layer 40 form parts of the side faces of the ridge 11. In this case, the active layer 40 comprises InGaN in the exemplary embodiment shown. In a further method step in accordance with FIG. 9C, said InGaN is laterally undercut by means of a wet-chemical etching process, such that the ridge 11 in the region of the active layer 40 has a smaller vertical ridge width 113' in comparison with the vertical ridge width 113 of the remaining regions of the ridge 111. The vertical ridge width 113, 113' thus has a constriction 62 in the region of the active layer 40 and thus in the active region.

Figure 10B:
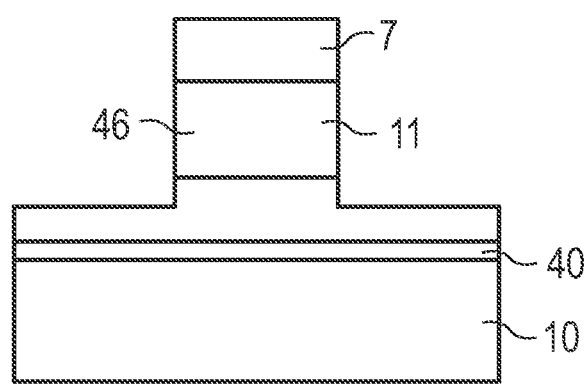
Figure 10C:
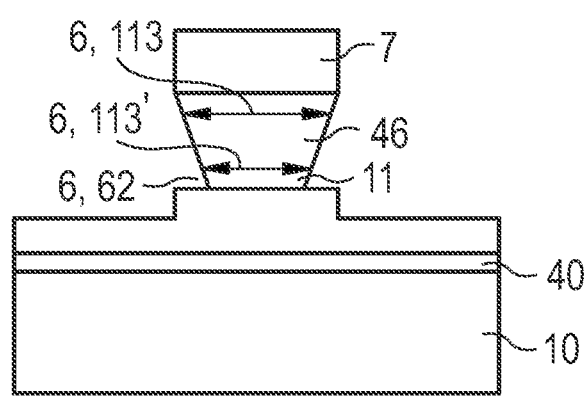

In the exemplary embodiment in accordance with FIGS. 10A to 10C, the ridge 11 is produced with a smaller ridge height in comparison with the exemplary embodiment in FIGS. 9A to 9C, such that the active layer 40 is not exposed by the ridge 11. Above the active layer 40, a functional layer 46 is present in the semiconductor layer sequence 10, which comprises at least one InGaN layer or else a plurality of InGaN layers having an identical or, as in the present exemplary embodiment, different In content. The layer 46 is laterally undercut by means of a wet-chemical etching step in accordance with FIG. 10C. The different In contents of the layers of the functional layer 46 result in different etching rates, as a result of which the ridge 11 forms with an undercut and thus with a vertical ridge width 113, 113' tapering toward the active layer 40 in the form of a constriction 62.

After the wet-chemical etching steps shown in FIGS. 9C and 10C, the hard mask 7 is removed in both methods. An electrode (not shown) is subsequently applied on the ridge 11. Furthermore, it is also possible for a passivation, for example, also a varying passivation in accordance with the previous exemplary embodiments, to be arranged alongside the ridge 11 respectively produced.

The connection with the methods shown in FIGS. 9A to 10C makes it possible to produce current and/or mode diaphragms as the mode filter structure 6 by means of a combination of wet-chemical and dry-chemical etching methods. By virtue of the fact that, in both exemplary embodiments, an upper part of the ridge is wider than a lower part, which is more relevant to the wave guidance, it is possible to produce a larger contact area with respect to an electrode applied on the ridge (not shown). As a result, the operating voltage of the laser light sources can be reduced, as a result of which the efficiency increases. This can be of great importance in particular for laser light sources comprising semiconductor layer sequences 10 based on a GaN material system, since the contact resistances, in particular p-doped layers, are comparatively high in the case of said material system.

FIGS. 11A to 14B show methods for producing laser light sources comprising mode filter structures 6 in which the mode filter structures 6 are produced by modifications of the semiconductor layer materials or succession of the semiconductor layer sequence 10.

Figure 11A:
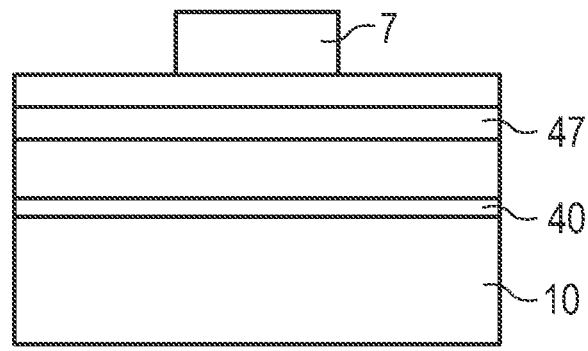
FIGS. 11A to 11C show schematic illustrations of a laser light source having an oxidation of ridge side faces in accordance with further exemplary embodiments.
Figure 11B:
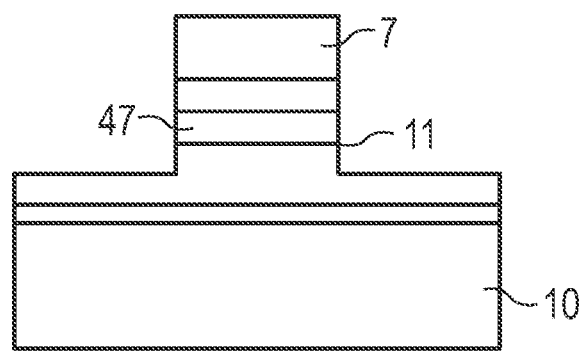
Figure 11C:
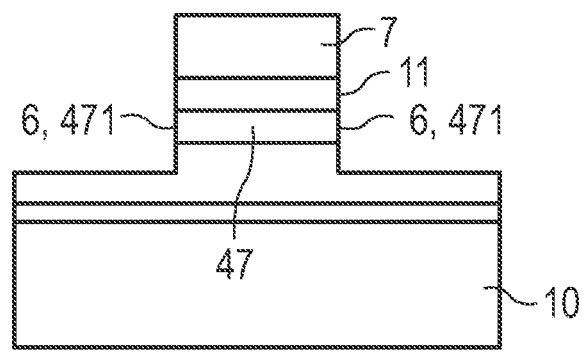

In the exemplary embodiment in accordance with FIGS. 11A to 11C, as in the previous exemplary embodiments in accordance with FIGS. 9A to 10C, a semiconductor layer sequence 10 is provided, which additionally has a functional layer 47 above the active layer 40, which contains aluminum.

After the production of the ridge 11 by means of a dry-chemical etching method in the method step in accordance with FIG. 11B, in which the functional layer 47 is exposed as part of the ridge 11, in a further method step by means of an oxidation step the exposed side faces of the functional layer 47 are oxidized, such that the functional layer 47 has an oxidation 471 at the side faces of the ridge 11, said oxidation serving as the mode filter structure 6 and thus as a current or mode diaphragm.

Figure 12A:
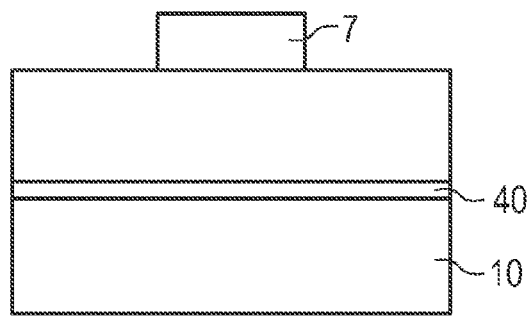
FIGS. 12A to 12D show schematic illustrations of laser light sources comprising conductivity-changing, refractive-index-changing and/or light-absorbing materials in accordance with further exemplary embodiments.
Figure 12B:
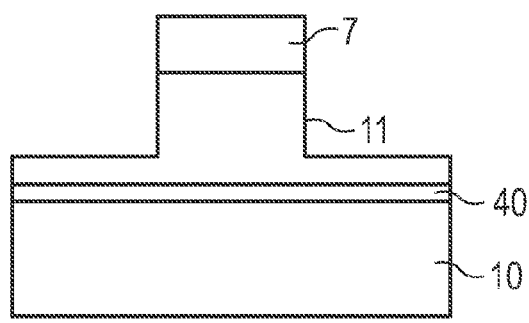
Figure 12C:
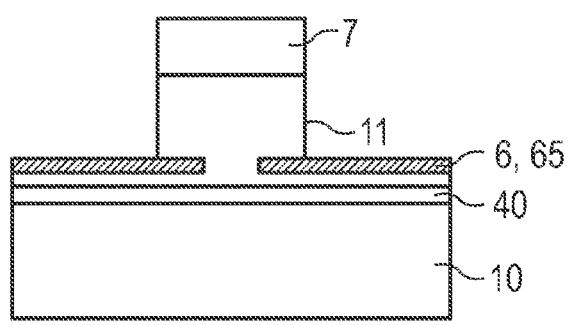

In conjunction with FIGS. 12A to 12C, a method for producing a laser light source in accordance with a further exemplary embodiment is shown, in which, after providing the semiconductor layer sequence 10, applying the hard mask 7 (FIG. 12A) and dry-chemical etching for forming the ridge 11 (FIG. 12B), by means of implantation or a thermal process such as, for example, diffusion into the region of the semiconductor layer sequence 10 alongside the ridge 11 and at least partly below the ridge 11, a material 65 is introduced which changes the conductivity of the semiconductor material and/or absorbs light. As a result, a mode filter structure 6 serving as a current and/or mode diaphragm can be produced by means of the introduced material 65. By way of example, as material 65, silicon can be introduced as a dopant which can change the conductivity of the p doped semiconductor layers formed above the active layer in the exemplary embodiment shown. As an alternative thereto, hydrogen can also be introduced, for example, in order to produce an electrically insulating region. By introducing a light-absorbing material such as germanium, for example, it is possible to change optical properties of the modified region of the semiconductor layer sequence 10.

Figure 12D:
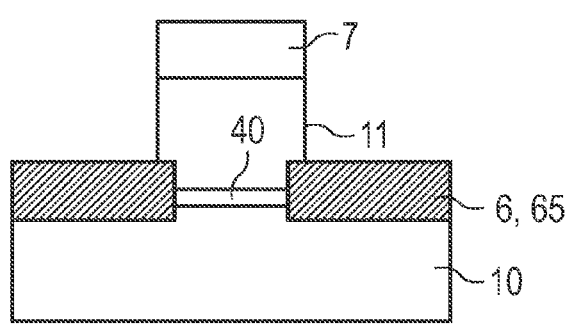

While in accordance with the exemplary embodiment in FIG. 12C the material is applied into a region above the active layer 40, it is also possible to introduce the material 65 as far as the active layer or even as far as below the active layer, as is shown in the exemplary embodiment in FIG. 12D.

FIGS. 13A to 14B show further exemplary embodiments in which the mode filter structure 6 is produced in the semiconductor layer sequence 10 by means of damaging the semiconductor material of the semiconductor layer sequence 10 in specific regions.

Figure 13A:
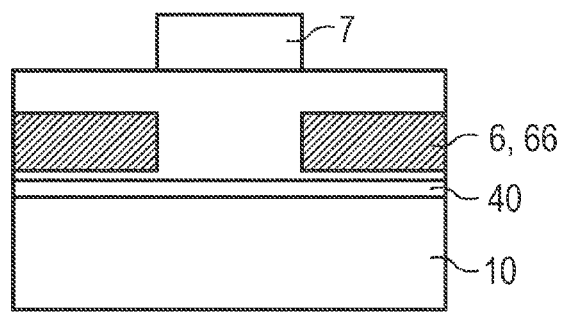
FIGS. 13A to 14B show schematic illustrations of laser light sources having regions having a damaged structure in accordance with further exemplary embodiments.
Figure 13B:
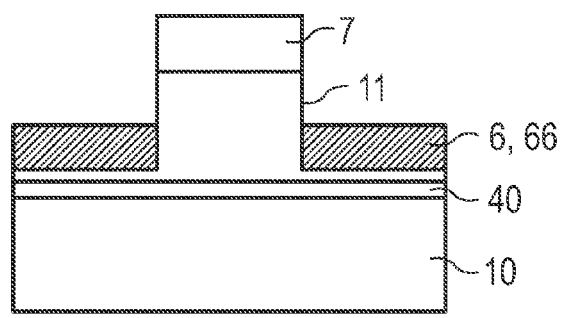

In the exemplary embodiment in FIGS. 13A and 13B, a semiconductor layer sequence 10 is provided, in which, with the aid of a short-pulse laser beam, the semiconductor material is permanently damaged by material being evaporated. Such a method can also be designated as "stealth dicing." Particularly, with the use of a group III-V compound semiconductor material, for example, a nitride compound semiconductor material such as InGaN, for example, in particular the group V component can be at least partly evaporated by a focused laser beam, as a result of which a damaged structure 66 is produced. The damage or the production of the damaged structure 66 can in this case be effected, as shown in FIG. 13A, above the active layer 40, in a p-doped region in the exemplary embodiment shown. In a further method step in accordance with FIG. 13B, the ridge 11 is produced by dry-chemical etching, wherein the damaged structure 66 is exposed alongside the ridge 11.

Figure 14A:
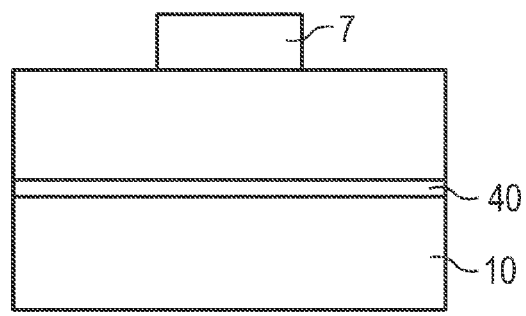
Figure 14B:
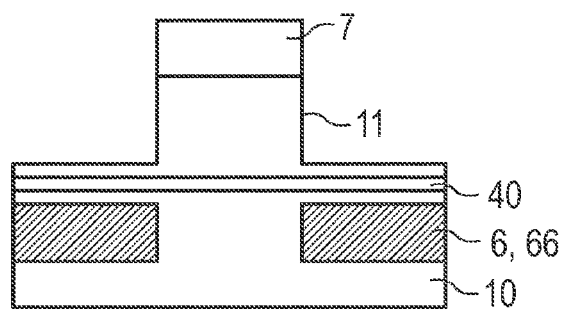

In the exemplary embodiment in accordance with FIGS. 14A and 14B, the damaged structure 66 is produced as the mode filter structure 6 below the active layer 40, in an n-doped region of the semiconductor layer sequence 10 in the exemplary embodiment shown. This can be effected, as shown in FIGS. 14A and 14B, after the production of the ridge. As an alternative thereto, the regions with the damaged structure 66 can also be produced before the production of the ridge 11.

Furthermore, it is also possible for the damaged structure 66 to project right into the active layer 40, either from the side above the active layer 40 or else from regions below the active layer 40. Furthermore, it is also possible for damaged structures 66 to be produced above and below and furthermore also additionally in the active layer 40.

In addition to the mode filter structures shown in conjunction with the exemplary embodiments in the Figures, still further etching structures can be present alongside or in the ridge region, which structures can contain, for example, additional absorbent materials in order to suppress higher modes to an even greater extent.

FIGS. 15A to 15G show further exemplary embodiments of laser light sources comprising mode filter structures 6 which additionally act as stray light filters. The stray light can comprise, for example, incoherent light that is generated in addition to the coherent fundamental mode in the active region. The stray light can furthermore also have higher modes which can establish oscillations and be guided, for example, in a manner driven by the incoherent stray light in the resonator. As a result of a reduction of the stray light by means of the mode filter structures 6 acting as stray light filters, said higher modes can thus also be suppressed. In addition, the mode filter structures 6 shown have features described in conjunction with the previous exemplary embodiments, which will therefore not be discussed any further hereinafter. In particular, the mode filter structures 6 shown in the previous exemplary embodiments can additionally also have the stray light filter structures 67 shown in FIGS. 15A to 15G.

Figure 15A:
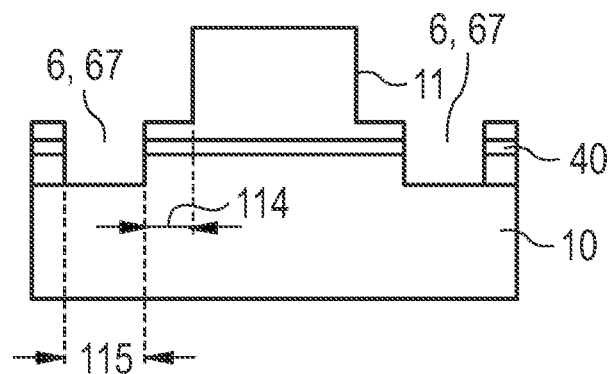
FIGS. 15A to 15G show schematic illustrations of laser light sources having stray light filters in accordance with further exemplary embodiments.
Figure 15B:
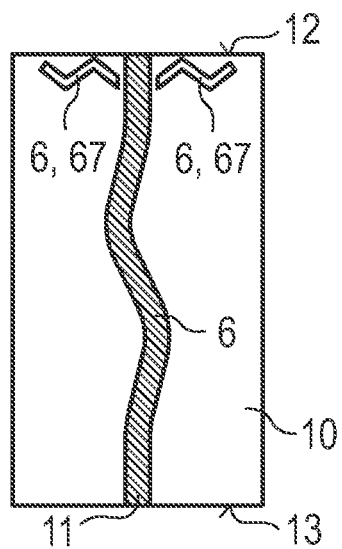
Figure 15C:
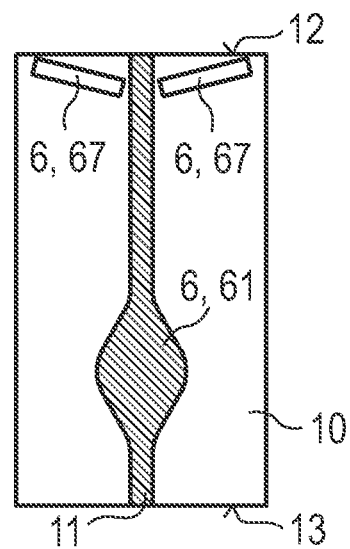
Figure 15D:
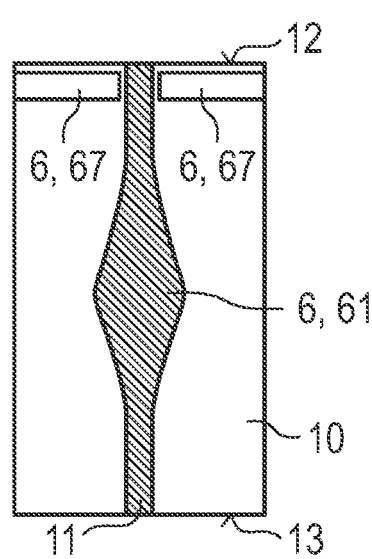
Figure 15E:
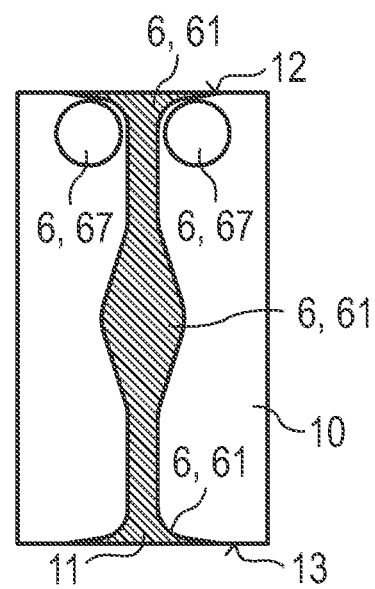
Figure 15F:
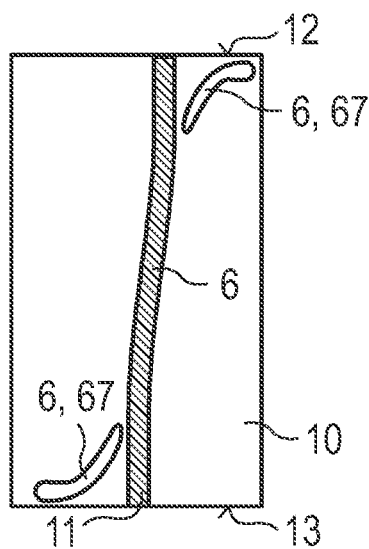
Figure 15G:
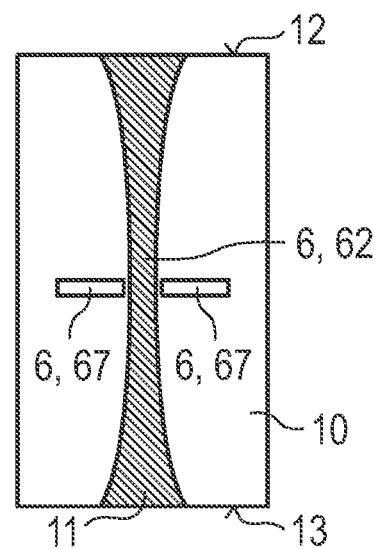

At least some of the above-described layer light sources comprising mode filter structures 6 are based on the fact that higher modes experience greater losses than the fundamental mode and are thereby damped. These losses can be scattering losses, for example. That can mean that scattered light is guided in the wave-guiding layers of the semiconductor layer sequence 10 alongside the ridge 11 and finally emerges at the radiation coupling-out area 12, which leads to disturbances in the far field. The mode filter structures 6 in accordance with the exemplary embodiments in FIGS. 15A to 15G therefore have additional structures 67 acting as stray light filters alongside the ridge 11. FIG. 15A in this case shows an exemplary sectional illustration through a laser light source in the region of the stray light filter structure 67, while FIGS. 15B to 15G show plan views of the semiconductor layer sequence 10 and the ridge 11.

Said stray light filter structure 67, as is shown in FIGS. 15B to 15G, can be situated at different positions along the ridge 11, but is preferably arranged near the radiation coupling-out area 12. In this case, the stray light filter structure 67 is, for example, at a distance of less than 300 μm, preferably of less than 100 μm, and particularly preferably of less than 50 μm, from the radiation coupling-out area 12.

The stray light filter structure 67 can have or can be for example a depression, for example, an etching trench, as is shown in FIG. 15A, which projects or is etched right into the wave-guiding layers of the semiconductor layer sequence 10 and particularly preferably through the active layer 40 and particularly preferably right into a cladding layer lying below the active layer 40, for example, an n doped cladding layer. Preferred depths are between 1 nm and 10,000 nm and particularly preferably between 100 nm and 2,000 nm deeper than the active layer 40, in each case inclusive of the limits.

The stray light filter structures 67 are at a distance 114 of 0 μm to 20 μm, preferably of 0 μm to 6 μm, and particularly preferably of 1 μm to 3 μm, from the ridge 11. The length 115 of the stray light filter structure 67 is between 0.1 μm and 500

μm, preferably between 1 μm and 100 μm, and particularly preferably between 3 μm and 30 μm, in each case inclusive of the limits. The stray light filter structures 67 are arranged at least on one side, but preferably on both sides, of the ridge 11 and have different forms, some of which are shown purely by way of example in FIGS. 15B to 15G. Preferably, the stray light filter structures 67 are embodied such that stray light is scattered away from the ridge or absorbed. For this purpose, the stray light filter structures 67 can preferably be covered by a passivation layer and/or be filled with absorbent materials.

The exemplary embodiments of laser light sources comprising mode filter structures as shown in the individual figures can in particular also be combined with one another. Particularly preferred combinations of mode filter structures can be a different ridge width, that is to say a varying horizontal and/or vertical ridge width, in combination with a varying ridge height and/or in combination with a varying passivation along the ridge and/or a combination of the two features mentioned last. Furthermore, a combination of at least one of the features mentioned for the mode filter structure with a curved ridge extension direction can be particularly advantageous. The features mentioned, that is to say in particular at least one or a plurality of the features mentioned for the mode filter structure, can also be particularly advantageous in combination with oxidized partial regions of at least one ridge side face and/or with materials introduced into the functional layer adjoining the ridge and/or with damaged regions of at least one functional layer. By means of the combinations of the different exemplary embodiments and features of the mode filter structure, the advantages of the individual variants can be combined with one another, while disadvantages that the individual variants may have can be compensated for by precisely such combinations and other additional features of the mode filter structure.

As a result, it can be possible that as a result of the different designs and possibilities for the technological realization of the mode filter structure, the output power in optical monomode operation can be increased, without other laser parameters being impaired in an undesirable manner.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A laser light source having a ridge waveguide structure, the laser light source comprising:
a semiconductor layer sequence having a plurality of functional layers and an active region configured to generate laser light during operation;
wherein at least one of the functional layers is embodied as a ridge of the ridge waveguide structure; and
wherein the semiconductor layer sequence has a mode filter structure, which is at least one of embodied as part of the ridge, disposed along a main extension plane of the functional layers alongside the ridge, or perpendicular to a main extension plane of the functional layers below the ridge; and
wherein the ridge adjoins a functional layer of the semiconductor layer sequence which has, as the mode filter structure, at least one of a conductivity-changing, or light-absorbing material.

2. The laser light source according to claim 1, wherein the ridge has, as the mode filter structure, a varying ridge height perpendicular to the main extension plane of the functional layers.

3. The laser light source according to claim 2, wherein the ridge height varies along a ridge extension direction.

4. The laser light source according to claim 2, wherein the ridge is delimited by two ridge side faces running along the ridge extension direction and the ridge side faces have at least partly different ridge heights.

5. The laser light source according to claim 1, further comprising a passivation arranged alongside the ridge as the mode filter structure, the passivation varying along a ridge extension direction.

6. The laser light source according to claim 5, wherein the ridge is delimited by two ridge side faces running along the ridge extension direction and different passivations are arranged alongside the ridge as the mode filter structure at the two ridge side faces.

7. The laser light source according to claim 1, wherein the ridge is delimited by two ridge side faces running along the ridge extension direction and has, as the mode filter structure, an oxidation of at least one partial region of a ridge side face.

8. The laser light source according to claim 7, wherein the ridge has an aluminum-containing functional layer, which is oxidized at at least one side face.

9. The laser light source according to claim 1, wherein the semiconductor layer sequence has at least one functional layer as the mode filter structure, which has at least partly a damaged structure that is disposed alongside the ridge, below the ridge, or both alongside and below the ridge.

10. The laser light source according to claim 1, wherein the ridge has, as the mode filter structure, at least one of a varying horizontal ridge width that is parallel to the main extension plane of the functional layers and perpendicular to a ridge extension direction or a varying vertical ridge width that is perpendicular to the main extension plane of the functional layers and perpendicular to the ridge extension direction.

11. The laser light source according to claim 10, wherein the horizontal ridge width has at least one thickening or constriction.

12. The laser light source according to claim 10, wherein the vertical ridge width has a constriction of the active region.

13. The laser light source according to claim 1, wherein the mode filter structure has, alongside the ridge, at least one stray light filter structure having a depression in the semiconductor layer sequence.

14. The laser light source according to claim 1, wherein the ridge has, as the mode filter structure, a curved ridge extension direction.

15. A laser light source having a ridge waveguide structure, the laser light source comprising:
a semiconductor layer sequence having a plurality of functional layers and an active region configured to generate laser light during operation;
wherein at least one of the functional layers is embodied as a ridge of the ridge waveguide structure;
wherein the semiconductor layer sequence has a mode filter structure, which is at least one of embodied as part of the ridge, disposed along a main extension plane of the functional layers alongside the ridge, or perpendicular to a main extension plane of the functional layers below the ridge;
wherein the ridge has, as the mode filter structure, a vertical ridge width that varies along a direction that is perpendicular to the main extension plane of the functional layers and that is further perpendicular to a ridge extension direction;

wherein the vertical ridge width has a constriction such that a first portion of the ridge has a first vertical ridge width and a second portion of ridge that is aligned directly over the first portion and that has a second vertical ridge width that is wider than the first vertical ridge width;

wherein the first portion of the ridge is between the active region and the second portion of the ridge.

16. The laser light source according to claim 15, wherein the vertical ridge width has a constriction of the active region.

17. A laser light source having a ridge waveguide structure, the laser light source comprising:

a semiconductor layer sequence having a plurality of functional layers and an active region configured to generate laser light during operation;

wherein at least one of the functional layers is embodied as a ridge of the ridge waveguide structure;

wherein the semiconductor layer sequence has a mode filter structure, which is at least one of embodied as part of the ridge, disposed along a main extension plane of the functional layers alongside the ridge, or perpendicular to a main extension plane of the functional layers below the ridge;

wherein a passivation is arranged alongside the ridge as the mode filter structure, the passivation having a first passivation region and a second passivation region that is adjacent to the first passivation region in a ridge extension direction;

wherein the ridge is delimited by two ridge side faces running along the ridge extension direction and the first and second passivation regions are arranged alongside the ridge as the mode filter structure at each of the two ridge side faces;

wherein the first passivation region has at least one of a different height or a different composition than the second passivation region; and wherein there is an abrupt or a continuous transition between the first and second passivation regions at each of the two ridge side faces.

18. A laser light source having a ridge waveguide structure, the laser light source comprising:

a semiconductor layer sequence having a plurality of functional layers and an active region configured to generate laser light during operation;

wherein at least one of the functional layers is embodied as a ridge of the ridge waveguide structure;

wherein the semiconductor layer sequence has a mode filter structure, which is at least one of embodied as part of the ridge, disposed along a main extension plane of the functional layers alongside the ridge, or perpendicular to a main extension plane of the functional layers below the ridge;

wherein the ridge has, as part of the mode filter structure, a curved ridge extension direction; and wherein the mode filter structure has, alongside the ridge, at least one stray light filter structure having a depression in the semiconductor layer sequence.

19. The laser light source according to claim 18, wherein the ridge extension direction has a continuous direction change.

20. A laser light source having a ridge waveguide structure, the laser light source comprising:

a semiconductor layer sequence having a plurality of functional layers and an active region configured to generate laser light during operation;

wherein at least a first one of the functional layers is embodied as a ridge of the ridge waveguide structure; and wherein the semiconductor layer sequence has at least a second one the functional layers as a mode filter structure;

wherein the mode filter structure is at least one of embodied as part of the ridge, disposed along a main extension plane of the functional layers alongside the ridge, or perpendicular to a main extension plane of the functional layers below the ridge; and wherein the mode filter structure comprises at least one of a conductivity-changing or light-absorbing material;

wherein the mode filter structure has at least partly a damaged structure that is disposed alongside the ridge, below the ridge, or both alongside and below the ridge; and wherein an undamaged portion of the semiconductor layer sequence is disposed directly over the damaged structure.

* * * * *